(12) United States Patent
Akagawa et al.

(10) Patent No.: US 11,315,981 B2
(45) Date of Patent: Apr. 26, 2022

(54) LIGHT-EMITTING DEVICE, AND ELECTRONIC APPARATUS

(71) Applicant: SEIKO EPSON CORPORATION, Tokyo (JP)

(72) Inventors: Suguru Akagawa, Matsumoto (JP); Jun Irobe, Chino (JP); Takeshi Koshihara, Matsumoto (JP)

(73) Assignee: SEIKO EPSON CORPORATION, Tokyo (JP)

( * ) Notice: Subject to any disclaimer, the term of this patent is extended or adjusted under 35 U.S.C. 154(b) by 95 days.

(21) Appl. No.: 16/936,940

(22) Filed: Jul. 23, 2020

(65) Prior Publication Data
US 2021/0028245 A1    Jan. 28, 2021

(30) Foreign Application Priority Data
Jul. 24, 2019    (JP) .............................. JP2019-135922

(51) Int. Cl.
*H01L 27/32*    (2006.01)
*H01L 51/52*    (2006.01)
*H01L 51/56*    (2006.01)
*H01L 51/50*    (2006.01)
*G02B 27/01*    (2006.01)

(52) U.S. Cl.
CPC ...... *H01L 27/3206* (2013.01); *G02B 27/0172* (2013.01); *G02B 27/0176* (2013.01); *H01L 51/5072* (2013.01); *H01L 51/5088* (2013.01); *H01L 51/5092* (2013.01); *H01L 51/5265* (2013.01); *H01L 51/56* (2013.01); *G02B 2027/015* (2013.01); *G02B 2027/0123* (2013.01); *H01L 27/322* (2013.01); *H01L 27/3244* (2013.01); *H01L 2251/5315* (2013.01); *H01L 2251/558* (2013.01)

(58) Field of Classification Search
CPC ..................... H01L 27/3206; H01L 2251/558
See application file for complete search history.

(56) References Cited

U.S. PATENT DOCUMENTS

| 2011/0317429 | A1 | 12/2011 | Aiba et al. |
| 2016/0240591 | A1 | 8/2016 | Song et al. |
| 2017/0236464 | A1 | 8/2017 | Koshihara |

FOREIGN PATENT DOCUMENTS

| JP | 2007-005123 A | 1/2007 |
| JP | 2007-333818 A | 12/2007 |
| JP | 2011-141990 A | 7/2011 |
| JP | 2011-165621 A | 8/2011 |
| JP | 2016-096162 A | 5/2016 |
| JP | 2017-146372 A | 8/2017 |
| JP | 2019-054006 A | 4/2019 |

*Primary Examiner* — Anthony Ho
(74) *Attorney, Agent, or Firm* — Oliff PLC

(57) ABSTRACT

A light-emitting device includes a semi-transmissive reflection layer, a first reflection layer that is disposed in a first sub-pixel, a second reflection layer that is disposed in a second sub-pixel, the second sub-pixel that emits same color light as the first sub-pixel, and a light-emitting functional layer that is disposed between the first reflection layer and the semi-transmissive reflection layer, the light-emitting functional layer that is disposed between the second reflection layer and the semi-transmissive reflection layer. A thickness of the light-emitting functional layer in the second sub-pixel is thicker than a thickness of the light-emitting functional layer in the first sub-pixel.

9 Claims, 15 Drawing Sheets

LIGHT-EMITTING DEVICE, AND ELECTRONIC APPARATUS

The present application is based on, and claims priority from JP Application Serial Number 2019-135922, filed Jul. 24, 2019, the disclosure of which is hereby incorporated by reference herein in its entirety.

BACKGROUND

1. Technical Field

The present disclosure relates to a light-emitting device, a method of manufacturing a light-emitting device, and an electronic apparatus.

2. Related Art

A known display device includes an organic electroluminescent (EL) element and a color filter through which light of a predetermine wavelength region can transmit. For example, a display device described in JP 2017-146372 A includes an organic EL element, a reflection layer, and a common electrode that functions as a semi-transmissive reflection layer, with a resonance structure producing resonance in light emitted from the organic EL element. Specifically, by optimizing the optical path length between the reflection layer and the common electrode for each color of light, red, green, and blue, the light of each color wavelength is strengthen by interference to improve light extraction efficiency. Note that the resonance structure is the same for each color of light in the display screen.

Also, in this Patent Document, a head mounted display (HMD) is used as the display device. The HMD includes an optical system including a projection lens, and enlarges an image of the display device and makes it visible to the user. There is a demand to decrease the size of these HMDs to improve the comfort when wearing, and improvements in high definition and compactness have been made. However, to produce a large virtual image with a smaller display device, the angle of view must be made larger.

In a known display device described in JP 2017-146372 A, as illustrated in FIG. 15, as the inclination of a principal ray increases, the extraction efficiency decreases, and the chromaticity changes. This is because when the principal ray is inclined, the optical path length is increased, and when the resonant wavelength is shifted, chromaticity deviation occurs. When the angle of view is increased, the chromaticity deviation at the peripheral edge portion, i.e., the display area end portion of the display device, is significant. Thus, known display devices lack sufficient visual field angle characteristics.

SUMMARY

A light-emitting device includes a first sub-pixel and a second sub-pixel disposed in a display region, the first sub-pixel and the second sub-pixel including a reflection layer, a semi-transmissive reflection layer, a light-emitting functional layer disposed between the reflection layer and the semi-transmissive reflection layer, the light-emitting device further including a resonance structure in which light emitted from the light-emitting functional layer resonates between the reflection layer and the semi-transmissive reflection layer, wherein in the first sub-pixel and in the second sub-pixel, a wavelength region of light emitted from the resonance structure is a first wavelength region, and a thickness of the light-emitting functional layer in the second sub-pixel is greater than a thickness of the light-emitting functional layer in the first sub-pixel.

In the light-emitting device described above, preferably, the first sub-pixel and the second sub-pixel include a pixel electrode disposed between the reflection layer and the light-emitting functional layer, and an insulating film having a first layer thickness and disposed between the reflection layer and the pixel electrode.

A light-emitting device includes a first sub-pixel, a second sub-pixel, and a third sub-pixel disposed in a display region, the first sub-pixel, the second sub-pixel, and the third sub-pixel including a reflection layer, a semi-transmissive reflection layer, a light-emitting functional layer disposed between the reflection layer and the semi-transmissive reflection layer, and an adjustment layer disposed between the reflection layer and the light-emitting functional layer, the light-emitting device further including a resonance structure in which light emitted from the light-emitting functional layer resonates between the reflection layer and the semi-transmissive reflection layer, wherein a thickness of the light-emitting functional layer in the second sub-pixel is greater than a thickness of the light-emitting functional layer in the first sub-pixel.

In the light-emitting device described above, preferably, the light-emitting functional layer in the first sub-pixel and the light-emitting functional layered in the third sub-pixel have an equal thickness, the adjustment layer in the first sub-pixel and the adjustment layer in the second sub-pixel have an equal thickness, and the adjustment layer in the third sub-pixel has a different thickness from those of the adjustment layer in the first sub-pixel and the adjustment layer in the second sub-pixel.

In the light-emitting device described above, preferably the first sub-pixel is disposed in a central area of the display region in plan view, and
the second sub-pixel is disposed in a peripheral area outside of the central area.

An electronic apparatus includes the light-emitting device described above.

A method for manufacturing a light-emitting device including a first sub-pixel and a second sub-pixel disposed in a display region, the first sub-pixel and the second sub-pixel including a reflection layer, an insulating film, a pixel electrode, a light-emitting functional layer, a semi-transmissive reflection layer, the light-emitting device further including a resonance structure in which light emitted from the light-emitting functional layer resonates between the reflection layer and the semi-transmissive reflection layer, includes forming the light-emitting functional layer via a vapor deposition method using a first mask defining the display region and a second mask including a plurality of opening portions, wherein
the first sub-pixel is disposed in a central area of the display region in plan view and the second sub-pixel is disposed in a peripheral area outside of the central area; and
the plurality of opening portions of the second mask have a higher density in the peripheral area corresponding to the second sub-pixel than in the central area corresponding to the first sub-pixel.

DESCRIPTION OF EXEMPLARY EMBODIMENTS

1. First Embodiment

In the present embodiment, an organic electroluminescent (EL) device is used as an example of a light-emitting device. This light-emitting device can be used in an electronic apparatus such as a head mounted display (HMD).

Note that in the following drawings, when necessary, XYZ axes are given as coordinate axes that are orthogonal to one another, with the arrows pointing in the + direction and the direction opposite the + direction being the − direction. The +Z direction is defined as upward and the −Z direction is defined as downward. "In a plan view" and "planar" mean looking down from the +Z direction. Also, in the following description, for example, "above the substrate" includes in its meaning "disposed above the substrate in contact with the substrate", "disposed above the substrate with a structure disposed between it and the substrate", "disposed above the substrate with a part in contact with the substrate", and "disposed above the substrate with a structure disposed between a part and the substrate".

1.1. Configuration of Organic EL Device

Figure 1:
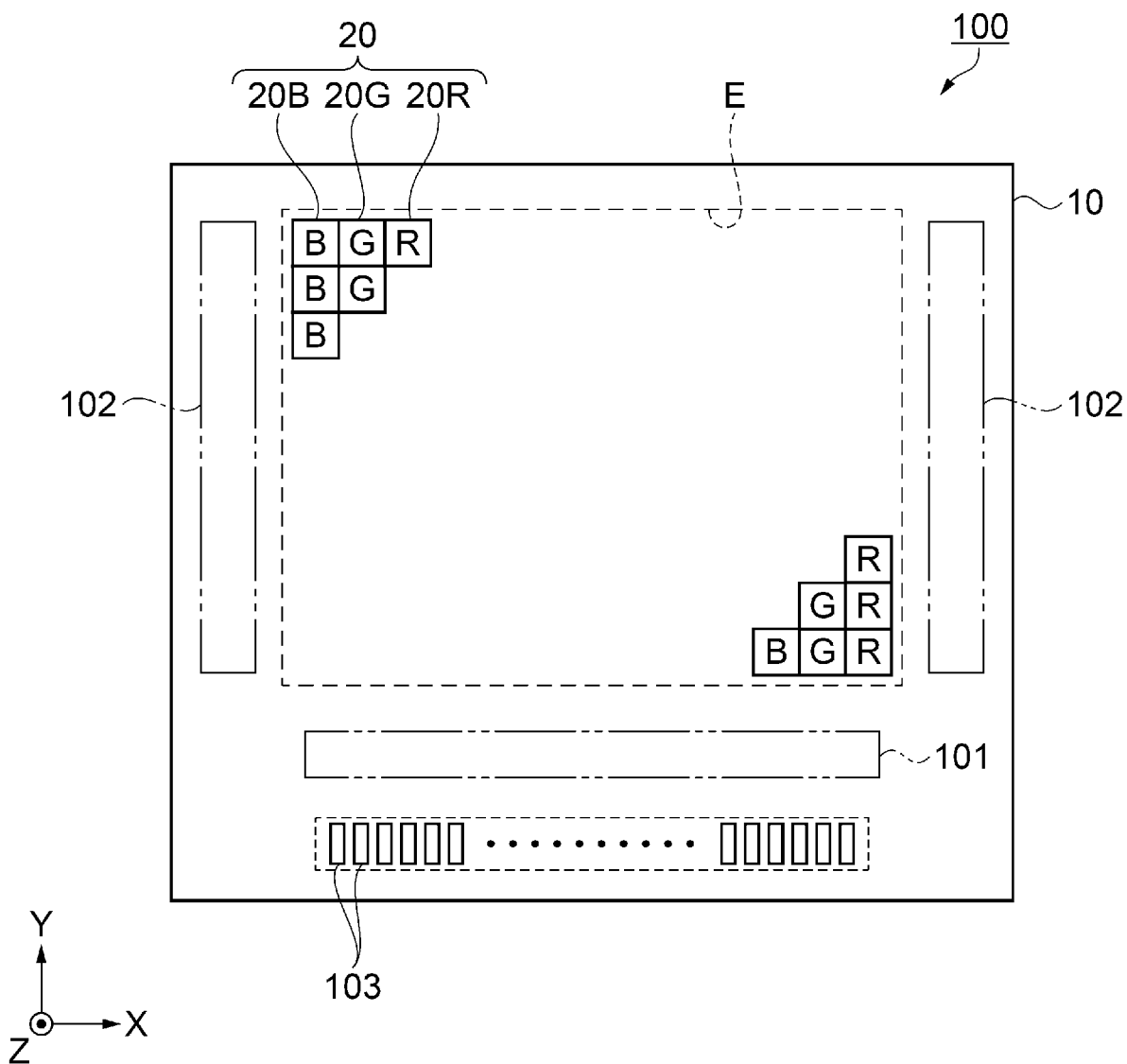
FIG. 1 is a schematic plan view illustrating the configuration of an organic EL device, i.e., a light-emitting device, according to a first embodiment.
Figure 2:
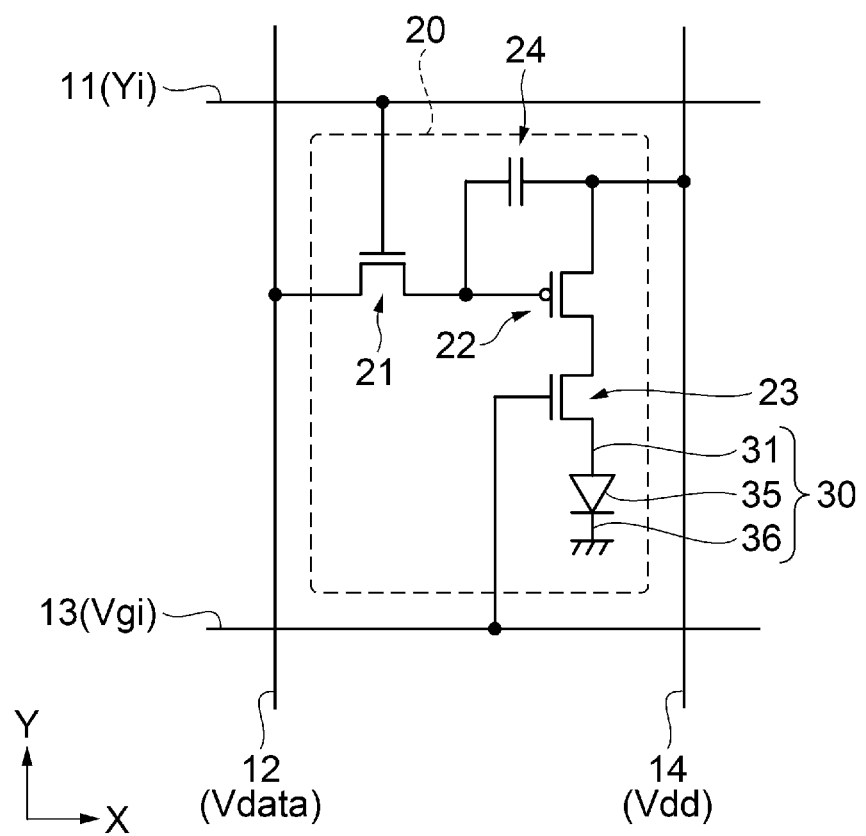
FIG. 2 is an equivalent circuit diagram illustrating the electrical configuration of a light-emitting pixel of the organic EL device.
Figure 3:
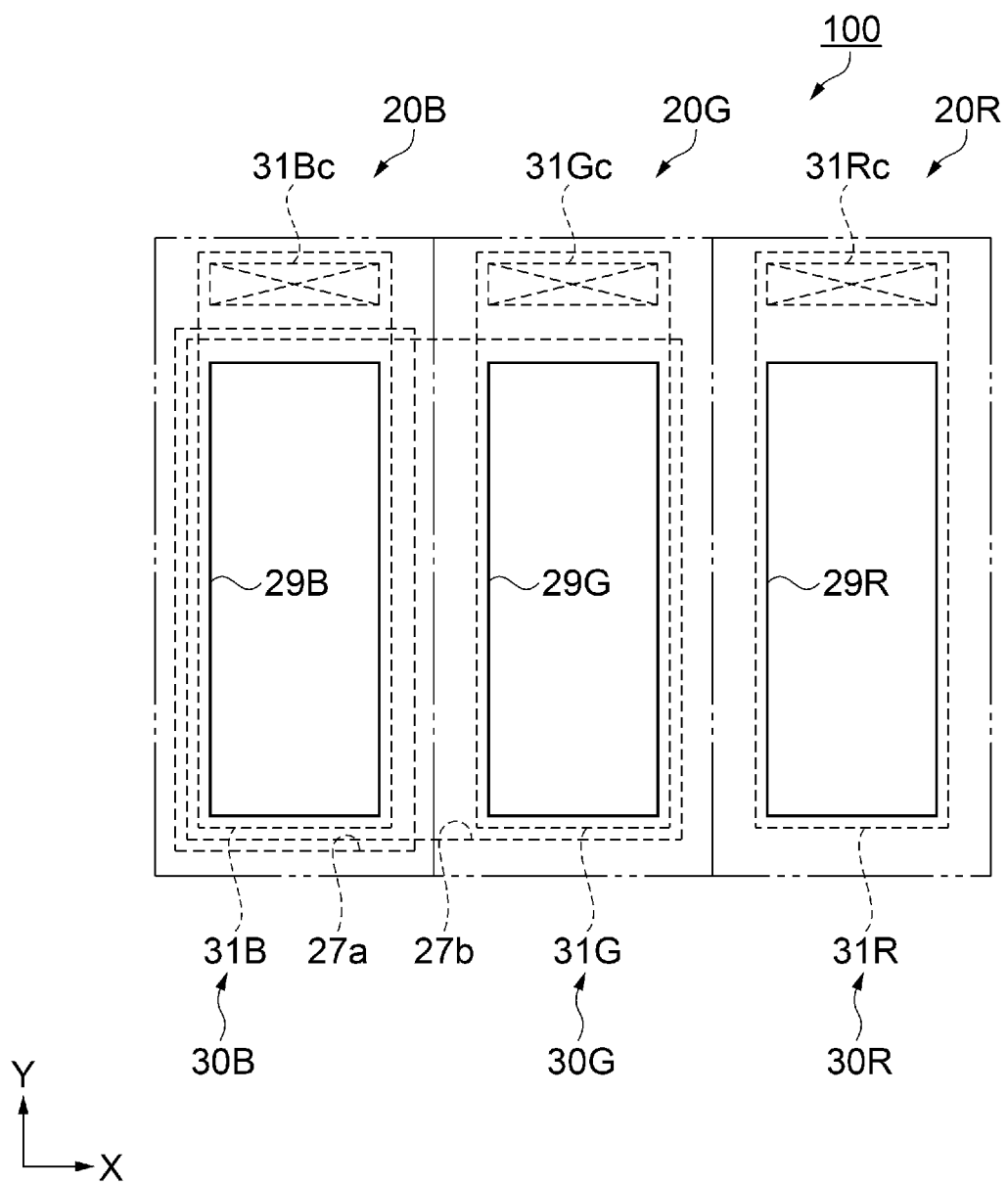
FIG. 3 is a schematic plan view illustrating the configuration of the light-emitting pixel of the organic EL device.

The configuration of an organic EL device, i.e., a light-emitting device, according to the present embodiment will be described with reference to FIGS. 1 to 3. FIG. 1 is a schematic plan view illustrating the configuration of an organic EL device, i.e., a light-emitting device, according to a first embodiment. FIG. 2 is an equivalent circuit diagram illustrating the electrical configuration of a light-emitting pixel of the organic EL device. FIG. 3 is a schematic plan view illustrating the configuration of the light-emitting pixel of the organic EL device.

As illustrated in FIG. 1, an organic EL device 100, i.e., a light-emitting device, includes an element substrate 10, a plurality of light-emitting pixels 20, a data line driving circuit 101, a pair of scanning line drive circuits 102, and a plurality of external connection terminals 103. The plurality of light-emitting pixels 20 are disposed in a matrix-like pattern in a display region E of the element substrate 10. The data line driving circuit 101 and the pair of scanning line drive circuits 102 are peripheral circuits for driving and controlling the plurality of light-emitting pixels 20. The plurality of external connection terminals 103 are electrically connected to an external circuit (not illustrated). The organic EL device 100 of the present embodiment is an active drive type and top-emitting light-emitting device. Hereinafter, the display region E may also be referred to as a "display surface".

A light-emitting pixel 20B for emitting blue light (B), a light-emitting pixel 20G for emitting green light (G), and a light-emitting pixel 20R for emitting red light (L) are disposed in the display region E. Also, the light-emitting pixels 20 that emit the same color light are arranged up and down in rows in the ±Y direction in a plan view. The light-emitting pixels 20 that emit different color light are arranged side by side in the ±X direction in a plan view in a repeating order of B, G, R.

This arrangement of the light-emitting pixels 20 is referred to as a stripe arrangement. However, the arrangement of the light-emitting pixels 20 is not limited thereto. For example, the light-emitting pixels 20 that emit different color light may be arranged side by side in the order of B, G, R or R, G, B, for example. Note that the direction in which the light-emitting pixels 20 emit light is the +Z direction and corresponds to the normal line direction with respect to the element substrate 10.

The detailed configuration of the light-emitting pixels 20 will be described below. The light-emitting pixels 20B, 20G, 20R in the present embodiment each include an organic EL element, i.e., a light-emitting element, and a color filter corresponding to a color B, G, or R. The color filter is configured to convert the light emitted from the organic EL element in to the colors B, G, and R, and display a full color display. Also, a light resonance structure for enhancing the brightness of light of a specific wavelength, from a wavelength range of the light emitted from the organic EL element, are formed for each light-emitting pixel 20B, 20G, 20R.

The plurality of light-emitting pixels 20B, 20G, 20R function as sub-pixels. In other words, the organic EL device 100 includes the plurality of light-emitting pixels 20B, 20G, 20R which are sub-pixels arranged in the display region E in the ±X direction and the ±Y direction.

One pixel unit in the image display is constituted by three light-emitting pixels 20B, 20G, 20R that emit B, G, and R light, respectively. In other words, one pixel of the display unit is constituted by three sub-pixels, the light-emitting pixels 20B, 20G, 20R arranged next to one another. Note that the configuration of the pixel unit is not limited thereto, and a light-emitting pixel 20 that emits light other than B, G, and R such as white may be included in the pixel unit.

The plurality of external connection terminals 103 are disposed side by side in the ±X direction along a first side portion of the element substrate 10. The data line driving circuit 101 is disposed between the external connection terminals 103 and the display region E in the ±Y direction and extends in the ±X direction. The pair of scanning line drive circuits 102 are disposed on either side of the display region E in the ±X direction.

As described above, the plurality of light-emitting pixels 20 are disposed in a matrix-like pattern in the display region E. As illustrated in FIG. 2, the element substrate 10 includes, as signal lines for the light-emitting pixels 20, a scan line 11, a data line 12, a lighting control line 13, and a power supply line 14. In the present embodiment, the scan line 11 and the lighting control line 13 extend in the ±X direction and the data line 12 and the power supply line 14 extend in the ±Y direction. Note that in the following description of FIG. 2, which is an equivalent circuit diagram, being electrically connected is simply referred to as being connected.

In the display region E, a plurality of the scan lines 11 and a plurality of the lighting control lines 13 are provided corresponding the m number of rows of the plurality of light-emitting pixels 20 arranged in a matrix-like pattern. The plurality of scan lines 11 and the plurality of lighting control lines 13 are connected to the pair of scanning line drive circuits 102 illustrated in FIG. 1. Also, a plurality of the data lines 12 and a plurality of the power supply lines 14 are provided corresponding the n number of rows of the plurality of light-emitting pixels 20 arranged in a matrix-like pattern. The plurality of data lines 12 are connected to the data line driving circuit 101 illustrated in FIG. 1. The plurality of power supply lines 14 are connected to at least one of the plurality of external connection terminals 103.

Forming the pixel circuit of the light-emitting pixel 20, a first transistor 21, a second transistor 22, a third transistor 23, a storage capacitor 24, and an organic EL element 30, i.e., light-emitting element, are provided in the region where the scan line 11 and the data line 12 intersect.

The organic EL element 30 includes a pixel electrode 31, which is an anode, a cathode 36, and a functional layer 35 including a light-emitting layer disposed between the two electrodes. The cathode 36 is an electrode provided in common with and spanning across the plurality of light-emitting pixels 20 and, for example, provides a low reference potential Vss or a ground (GND) potential, with a power supply voltage Vdd from the power supply line 14.

The first transistor 21 and the third transistor 23 are, for example, n-channel transistors. The second transistor 22 is, for example, a p-channel transistor.

In the first transistor 21, a gate electrode is connected to the scan line 11, one current end is connected to the data line 12, and the other current end is connected to a gate electrode of the second transistor 22 and one electrode of the storage capacitor 24.

One current end of the second transistor 22 is connected to the power supply line 14 and is connected to the other electrode of the storage capacitor 24. The other current end of the second transistor 22 is connected to one current end of the third transistor 23. In other words, the second transistor 22 and the third transistor 23 each include a pair of current ends, with one being shared.

In the third transistor 23, a gate electrode is connected to the lighting control line 13 and the other current end is connected to the pixel electrode 31 of the organic EL element 30. For the pair of current ends of each of the first transistor 21, the second transistor 22, and the third transistor 23, one is a source and the other is a drain.

In such a pixel circuit, when the voltage level of a scan signal Yi supplied to the scan line 11 from the scanning line drive circuits 102 is high, the n-channel first transistor 21 is ON. The data line 12 and the storage capacitor 24 are electrically connected via the first transistor 21 in an ON state. Then, when a data signal is supplied to the data line 12 from the data line driving circuit 101, the potential difference between a voltage level Vdata of the data signal and the power supply voltage Vdd provided by the power supply line 14 is stored in the storage capacitor 24.

When the voltage level of a scan signal Yi supplied to the scan line 11 from the scanning line drive circuits 102 is low, the n-channel first transistor 21 is OFF. Thus, the gate-source voltage Vgs of the second transistor 22 is held at the voltage of when the voltage level Vdata is provided. Also, when the scan signal Yi reaches a low level and the voltage level of a lighting control signal Vgi supplied to the lighting control line 13 is high, the third transistor 23 is ON. In this way, a current corresponding to the gate-source voltage Vgs of the second transistor 22 flows between the source and the drain of the second transistor 22. Specifically, this current flows in a path from the power supply line 14, through the second transistor 22 and the third transistor 23, to the organic EL element 30.

The organic EL element 30 emits light in accordance with the size of the current flowing in the organic EL element 30. The current flowing in the organic EL element 30 is determined by the second transistor 22 configured by the voltage Vgs between the gate and the source of the second transistor 22 and the operation point of the organic EL element 30. The voltage Vgs between the gate and the source of the second transistor 22 is the voltage held in the storage capacitor 24 by the potential difference between the voltage level Vdata of the data line 12 and the power supply voltage Vdd when the scan signal Yi is at a high level. In this manner, the brightness of the light emitted from the light-emitting pixel 20 is determined by the length of time that the voltage level Vdata in the data signal and the third transistor 23 are in the on state. In other words, the value of the voltage level Vdata in the data signal enables the brightness of the light-emitting pixel 20 to have a gradation corresponding to image information.

Here, the pixel circuit of the light-emitting pixel 20 is not limited to including the three transistors 21, 22, and 23, and is only required to be a pixel circuit capable of displaying and driving the light-emitting pixel 20. For example, the pixel circuit may have a configuration in which two transistors are used. The transistor of the pixel circuit may be an n-channel transistor, a p-channel transistor, or the pixel circuit may include both an n-channel transistor and a p-channel transistor. Furthermore, the transistor of the pixel circuit of the light-emitting pixel 20 may be a metal oxide semiconductor (MOS) field effect transistor including an active layer on a semiconductor substrate, a thin-film transistor, or a field effect transistor.

As illustrated in FIG. 3, each of the light-emitting pixels 20B, 20G, 20R is rectangular in a plan view with the longitudinal direction disposed corresponding to the ±Y direction. Each of the light-emitting pixels 20B, 20G, 20R is provided with the organic EL element 30 of the equivalent circuit illustrated in FIG. 2. Here, in order to distinguish between the different organic EL elements 30 provided for the light-emitting pixels 20B, 20G, 20R, the organic EL elements 30 may be described using organic EL elements 30B, 30G, 30R. Also, in order to distinguish between the different pixel electrodes 31 of the organic EL elements 30 provided for the light-emitting pixels 20B, 20G, 20R, the pixel electrodes 31 may be described using pixel electrodes 31B, 31G, 31R.

The pixel electrode 31B and a contact portion 31Bc that electrically connects the pixel electrode 31B and the third transistor 23 are provided in the light-emitting pixel 20B. In a similar manner, the pixel electrode 31G and a contact portion 31Gc that electrically connects the pixel electrode 31G and the third transistor 23 are provided in the light-emitting pixel 20G. The pixel electrode 31R and a contact portion 31Rc that electrically connects the pixel electrode 31R and the third transistor 23 are provided in the light-emitting pixel 20R. The pixel electrodes 31B, 31G, 31R are substantially rectangular in a plan view, and the contact portions 31Bc, 31Gc, 31Rc are disposed on the +Y direction in the longitudinal direction of the pixel electrodes 31B, 31G, 31R.

The light-emitting pixels 20B, 20G, 20R include openings 29B, 29G, 29R, respectively. The openings 29B, 29G, 29R are insulation structures that electrically isolate adjacent pixel electrodes 31 and define regions above the pixel electrodes 31B, 31G, 31R in contact with the functional layer 35. In the present embodiment, the openings 29B, 29G, 29R have the same shape and size.

1.2. Configuration of Light-Emitting Pixel

Figure 4:
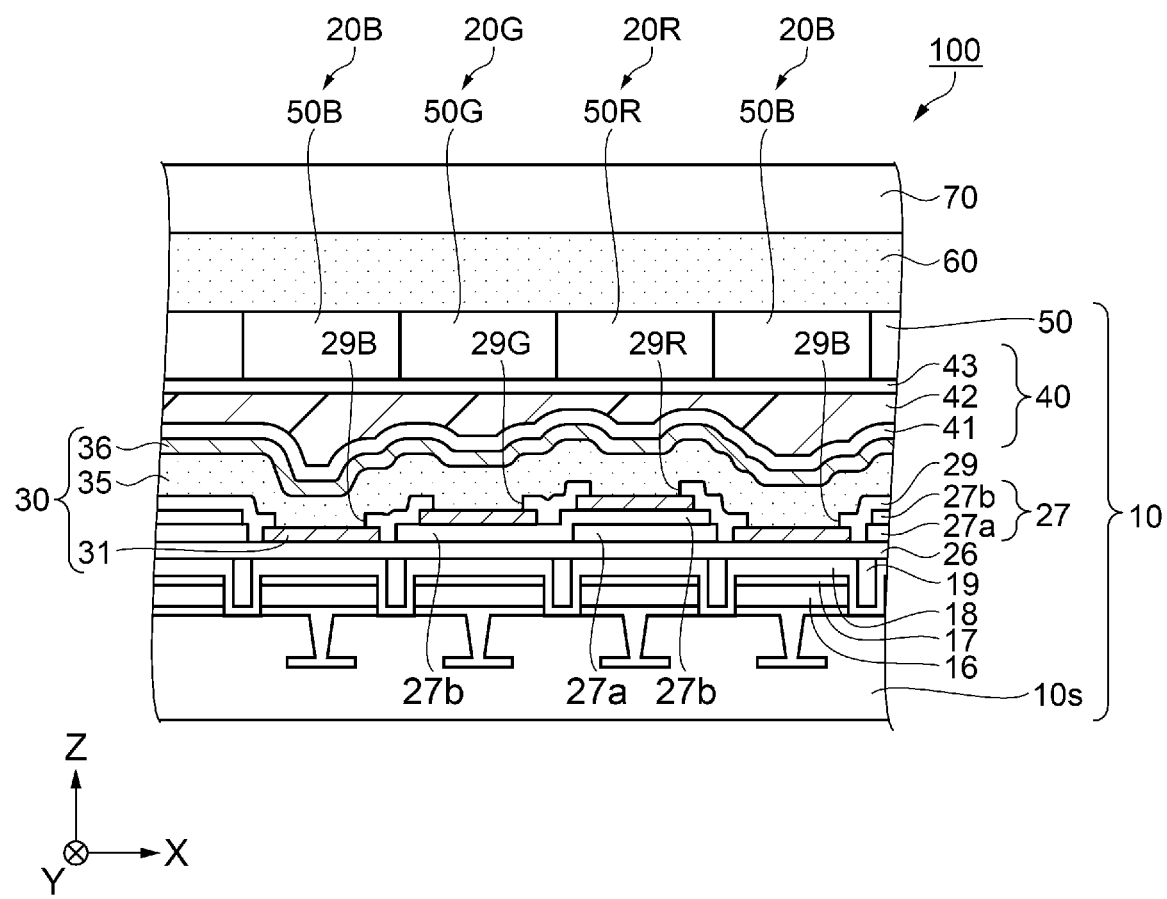
FIG. 4 is a schematic cross-sectional view of the light-emitting pixel along the XZ plane.

The configuration of the light-emitting pixel 20 will be described with reference to FIG. 4. FIG. 4 is a schematic cross-sectional view of a light-emitting pixel along the XZ plane. Note that, in FIG. 4, the first transistor 21, the second transistor 22, the third transistor 23, and the like are omitted from the drawing.

As illustrated in FIG. 4, the organic EL device 100 includes the element substrate 10 including the light-emitting pixels 20B, 20G, 20R, a color filter 50, and the like, and a transmissive sealing substrate 70. The element substrate 10 and the sealing substrate 70 are bonded together by a resin layer 60 having both adhesiveness and transparency.

The color filter 50 includes filter layers 50B, 50G, 50R corresponding to the colors B, G, and R. The filter layers 50B, 50G, 50R are disposed in the element substrate 10 corresponding to the light-emitting pixels 20B, 20G, 20R, respectively.

The organic EL device 100 is a top emission structure in which light emission is extracted from the sealing substrate 70 side. Light emitted from the functional layer 35 of the organic EL element 30 passes through the corresponding filter layer 50B, 50G, 50R and is emitted from the sealing substrate 70 side.

In the present embodiment, a silicon substrate is used for a substrate 10s of the element substrate 10. In order to employ a top emission structure, an opaque ceramic substrate or a semiconductor substrate may be used for the substrate 10s.

As well as the connection wiring, such as the connection transistors and the contact portions described above, a pixel circuit layer (not illustrated), a reflection layer, i.e., a reflection electrode 16, an enhanced reflection layer 17, a first protection layer 18, an embedded insulating layer 19, a second protection layer 26, an adjustment layer 27, the organic EL element 30, a pixel separating layer 29, a sealing layer 40, the color filter 50, and the like are formed above the substrate 10s.

The reflection electrode 16 functions as a reflection layer of the resonance structure described below and is formed from a light reflective and electrically conductive material. Examples of the material include metals such as Al (aluminum), Ag (silver), Cu (copper), and Ti (titanium) and alloys of these metals. A multilayer structure may also be used. In the present embodiment, a Ti/Al—Cu two-layer structure is used, and an Al—Cu alloy is used for the reflective surface to reflect light. The layer thickness of the reflection electrode 16 is not particularly limited, but is approximately 150 nm, for example. The reflection electrode 16 is flat and has a wider form factor in a plan view than the openings 29B, 29G, 29R of the light-emitting pixels 20. Note that in the present specification, "layer thickness" refers to the thickness of a layer in the ±Z direction.

The enhanced reflection layer 17 is a silicon oxide film formed above the reflection electrode 16 and functions as an enhanced reflection layer that enhances light reflectivity. The enhanced reflection layer 17 is also used as a hard mask for patterning in the step of forming the reflection electrode 16. Thus, in this forming step, where the reflection electrode 16 is partitioned for each light-emitting pixel 20, a groove is formed around the light-emitting pixel 20. In other words, as illustrated in FIG. 4, a groove is provided between the reflection electrode 16 of a certain light-emitting pixel 20 and the reflection electrode 16 of the adjacent light-emitting pixel 20. The layer thickness of the enhanced reflection layer 17 is not particularly limited, but is approximately 35 nm, for example.

The first protection layer 18 is a silicon nitride film formed above the enhanced reflection layer 17 and on the inner surface of the groove partitioning the light-emitting pixels 20. To form the enhanced reflection layer 17, a plasma-enhanced chemical vapor deposition (CVD) method is used, for example.

The embedded insulating layer 19 is a silicon oxide film that is embedded in the groove that partitions the light-emitting pixels 20 to form a level surface. To form the embedded insulating layer 19, a high density plasma-enhanced CVD method is used, for example. The silicon oxide layer is formed by forming the silicon oxide layer above the enhanced reflection layer 17 in the groove that partitions the light-emitting pixels 20, selectively forming resists at the top portion of the grooves, and etching back the entire surface. In this way, the first protection layer 18 is etched back and exposed and the grooves are filled up with the embedded insulating layer 19 to form a level surface.

The second protection layer 26 is a flat silicon nitride film formed above the first protection layer 18 and the embedded insulating layer 19. To form the second protection layer 26, a plasma-enhanced CVD method is used, for example. The total layer thickness of the first protection layer 18 and the second protection layer 26 is not particularly limited, but is approximately 55 nm, for example.

The adjustment layer 27 is a portion of the adjustment layer for adjusting the length of the optical path, that is, the optical path length, in the resonance structure described below, and is also an example of an insulating film of the present disclosure. Specifically, in the light-emitting pixel 20G, a single layer, a second adjustment layer 27b, is formed above the second protection layer 26 as the adjustment layer 27. In the light-emitting pixel 20R, a first adjustment layer 27a and the second adjustment layer 27b are formed above the second protection layer 26 as the adjustment layer 27. In the light-emitting pixel 20B, the adjustment layer 27 is not formed above the second protection layer 26, and the pixel electrode 31B is formed directly above the second protection layer 26. The first adjustment layer 27a and the second adjustment layer 27b are silicon oxide films. The adjustment layer 27 is described in detail below.

The pixel electrode 31 is a light transmissive anode formed of a transparent, electrically conducting film having light transmissivity and electrical conductivity. In a preferred example of the present embodiment, indium tin oxide (ITO) is used. The pixel electrode 31 is formed as a film, for example, using a sputtering method, and is then partitioned by patterning for each sub-pixel. The layer thickness of the pixel electrode 31 is not particularly limited, but is approximately 20 nm, for example.

The pixel separating layer 29 is formed between adjacent pixel electrodes 31 and partitions the openings 29B, 29G, 29R of the light-emitting pixels 20. Silicon oxide is used as the forming material of the pixel separating layer 29.

The organic EL element 30 has a configuration in which the functional layer 35 is sandwiched between the pixel electrode 31 and the cathode 36, i.e., a semi-transmissive reflection layer. The functional layer 35 has a multilayer structure. The layer thickness of the functional layer 35 is not particularly limited, but is, for example, approximately 100 nm in a central area of the display region E in a plan view. The functional layer 35 is described in detail below.

The cathode 36 is semi-transmissive reflective. In the present embodiment, a thin film of a MgAg alloy in which Mg (magnesium) and Ag are co-deposited is used as the cathode 36. The layer thickness of the cathode 36 is not particularly limited, but is approximately 20 nm, for example.

The sealing layer 40 includes a first inorganic sealing layer 41, an organic intermediate layer 42, and a second inorganic sealing layer 43. The first inorganic sealing layer 41 is formed by covering the cathode 36 with a forming material having excellent gas barrier properties and transparency. Examples of the forming material include inorganic compounds such as silicon oxide, silicon nitride, silicon oxynitride, titanium oxide, and other metal oxides. In a preferred example of the present embodiment, silicon oxynitride is used for the first inorganic sealing layer 41. The layer thickness of the sealing layer 40 is not particularly limited, but is approximately 400 nm, for example.

The organic intermediate layer 42 is an organic resin layer with transparency formed over the first inorganic sealing layer 41. In a preferred example, epoxy resin is used as the forming material of the organic intermediate layer 42. In forming the organic intermediate layer 42, the forming material is applied by a printing method or a spin coating method and cured. The resulting organic intermediate layer 42 is formed level and covers projections and depressions and foreign material in the surface of the first inorganic sealing layer 41.

The second inorganic sealing layer 43 is an inorganic compound layer and is formed over the organic intermediate layer 42. The second inorganic sealing layer 43, similar to the first inorganic sealing layer 41, has transparency and gas barrier properties and is formed using an inorganic compound having excellent water resistance and heat resistance. In a preferred example of the present embodiment, silicon oxynitride is used for the second inorganic sealing layer 43.

The color filter 50 is formed above the second inorganic sealing layer 43, which has a flattened surface. The filter layers 50B, 50G, 50R of the color filter 50 are formed by applying a photosensitive resin including a pigment correspond to the colors, exposing the resin to light, then development.

1.3. Light Resonance Structure

Figure 5:
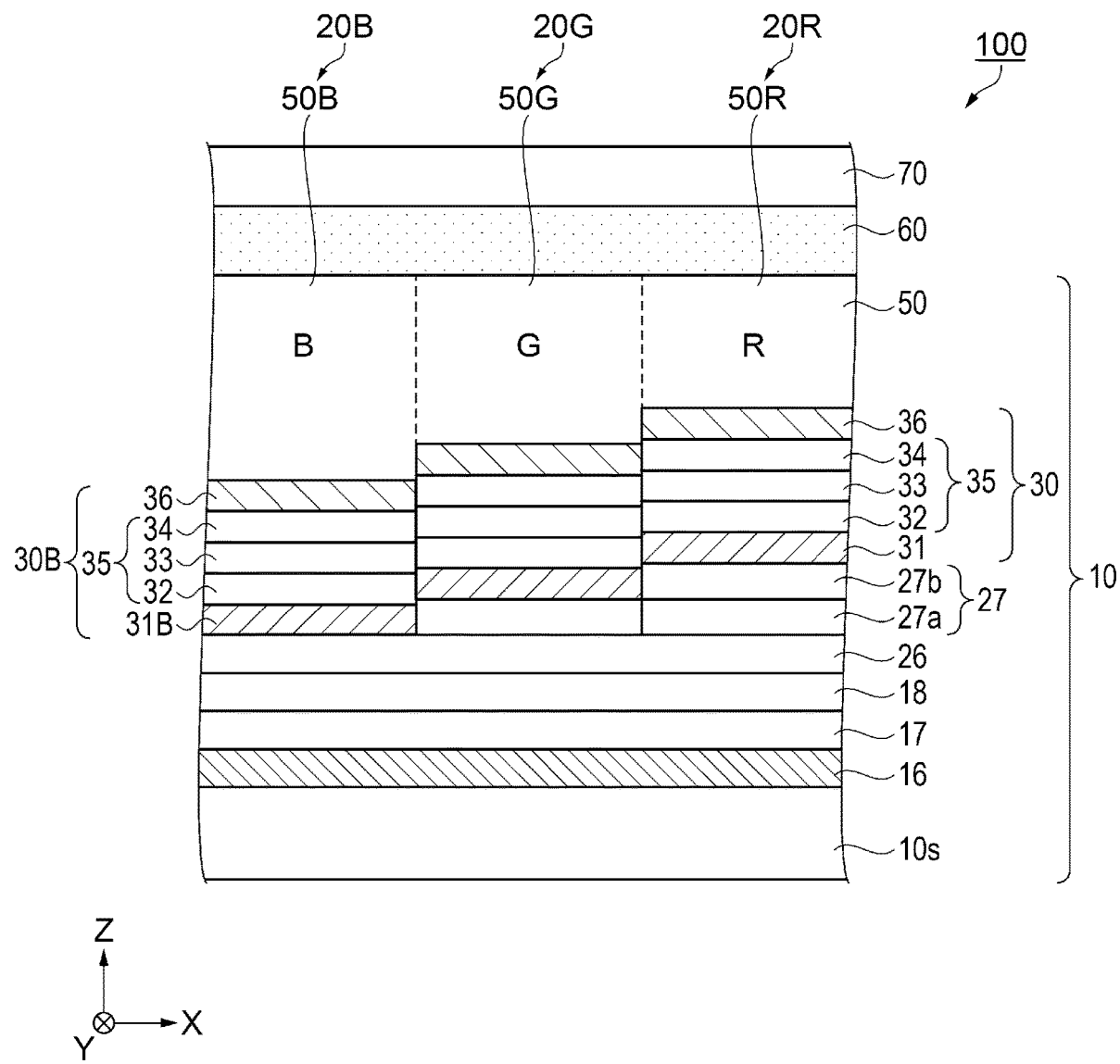
FIG. 5 is a schematic cross-sectional view illustrating a resonance structure of the light-emitting pixel.

The resonance structure of the light-emitting pixels 20 will be described with reference to FIG. 5. FIG. 5 is a schematic cross-sectional view illustrating the resonance structure of the light-emitting pixel. Note that in FIG. 5, the region corresponding to the light-emitting pixels 20B, 20G, 20R in FIG. 4 is enlarged.

As illustrated in FIG. 5, the organic EL element 30 is sandwiched between the pixel electrode 31 and the cathode 36 as a functional layer 35. That is, the light-emitting pixels 20B, 20G, 20R, which are sub-pixels, each include the reflection electrode 16, i.e., a reflection layer, the cathode 36, i.e., a semi-transmissive reflection layer, and the functional layer 35, i.e., a light-emitting functional layer, disposed between the reflection electrode 16 and the cathode 36. Also, the light-emitting pixels 20B, 20G, 20R each include the pixel electrode 31 disposed between the reflection electrode 16 and the functional layer 35. The light-emitting pixels 20G, 20R are disposed between the reflection electrode 16 and the pixel electrode 31 and include the adjustment layer 27, which is an insulating film having a first layer thickness.

The first layer thickness is the thickness in the ±Z direction of the adjustment layer 27 and differs depending on the color type of the light-emitting pixel 20 the adjustment layer 27 is provided in. The first layer thickness is not particularly limited, but is approximately 50 nm in the case of the light-emitting pixel 20G and approximately 110 nm in the case of the light-emitting pixel 20R, for example. The light-emitting pixel 20B is not provided with the adjustment layer 27 between the reflection electrode 16 and the pixel electrode 31. Note that the light-emitting pixel 20B may have a configuration including the adjustment layer 27 as an insulating film having a first layer thickness different from that of the light-emitting pixels 20G, 20R.

Here, the pixel electrode 31 and the adjustment layer 27 provided between the reflection electrode 16 and the functional layer 35 have the function of adjusting the optical path length, which is the optical distance in the resonance structure described below. The pixel electrode 31 and the adjustment layer 27 are examples of the adjustment layer of the present invention.

The functional layer 35 is an organic light-emitting layer including a hole injecting layer (HIL) 32, an organic light-emitting layer (EML) 33, and an electron transport layer (ETL) 34, which are layered sequentially from the pixel electrode 31 side upward. Each of these layers is formed using, for example, a vapor deposition method.

By applying a driving potential between the pixel electrode 31 and the cathode 36, holes are injected into the functional layer 35 from the pixel electrode 31, and electrons are injected into the functional layer 35 from the cathode 36. In the organic light-emitting layer 33 in the functional layer 35, excitons are formed by the injected holes and electrons, and when the excitons decay, some of the resulting energy is radiated as fluorescence or phosphorescence. Note that, in addition to the hole injecting layer 32, the organic light-emitting layer 33, and the electron transport layer 34, the functional layer 35 may include a hole transport layer, an electron injecting layer, or an intermediate layer that improves or controls injectability and transport properties of holes or electrons into the organic light-emitting layer 33.

By applying a driving voltage to the organic EL element 30, the organic light-emitting layer 33 emits a white light. In a preferred example, a white light can be obtained by combining organic light-emitting layers capable of emitting light of blue (B), green (G), and red (R). Further, a pseudo-white light can be also obtained by combining organic light-emitting layers capable of emitting light of blue (B) and yellow (Y). The functional layer 35 is formed in common with and spanning across the light-emitting pixels 20B, 20G, 20R.

In the organic EL device 100, a resonance structure is provided in which light emitted by the functional layer 35 resonates between the reflection electrode 16 and the cathode 36. Thus, light emission with enhanced brightness at a resonant wavelength corresponding to each of the light emission colors of B, G, R is obtained.

The resonant wavelength for each of the light-emitting pixels 20B, 20G, 20R in the resonance structure is determined by an optical distance D between the reflection electrode 16 and the cathode 36, and specifically, is set to satisfy the following Formula (1). Note that the distance D is also referred to as the optical path length.

$$D=\{(2\pi m+\varphi L+\varphi U)/4\pi\}\lambda \quad (1)$$

In Formula (1), m is 0 and a positive integer (m=0, 1, 2, . . . ), $\varphi L$ is the phase shift in reflection at the reflection electrode 16, $\varphi U$ is the phase shift in reflection at the cathode 36, and $\lambda$ is the peak wavelength of the standing wave. Also, the optical distance of each layer in the resonance structure is expressed as the product of the layer thickness and the refractive index of each layer through which light is transmitted. In the present specification, "layer thickness" refers to the thickness of a layer in the ±Z direction.

Formula (1) is a basic formula in the case where the principal ray is in a direction perpendicular to the display surface, and is not specified when the principal ray is at an incline. In particular, when the angle of view is increased in smaller display devices, the angle of the principal ray increases and the optical path length increases at the peripheral edge portion of the display area, and chromaticity deviation occurs. In light of this, the inventor and the like have devised a configuration in which the optical path length is adjusted based on the angle of view in consideration of Formula (1). Prior to the description of the specific configuration, the problems of the prior art will be described.

1.4. Angle of View and Optical Path Length

Figure 6A:
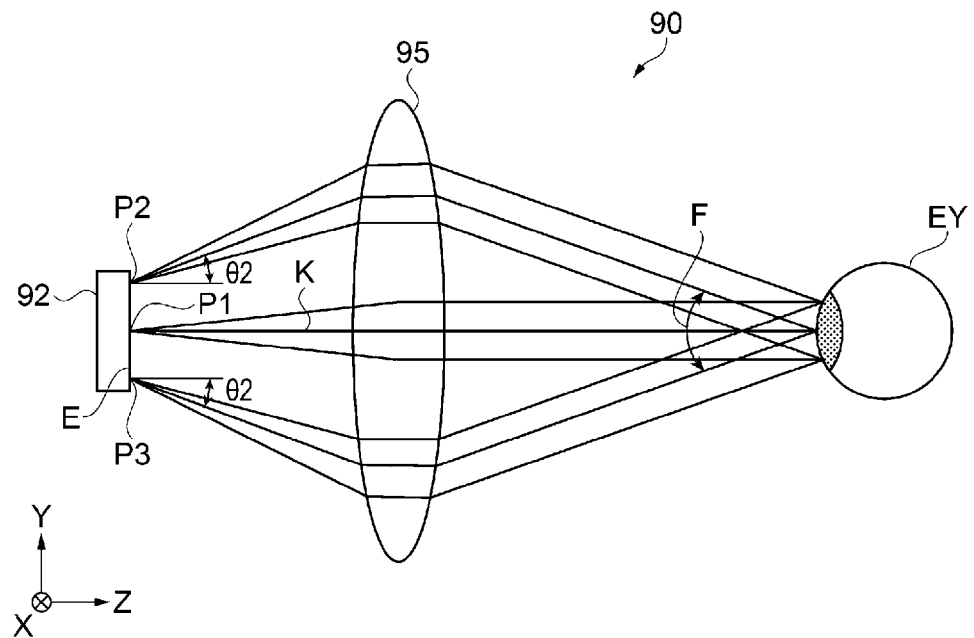
FIG. 6A is a schematic diagram illustrating an optical system of a device that displays a virtual image.
Figure 6B:
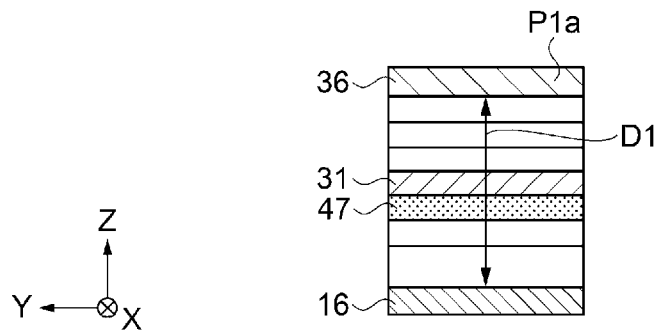
FIG. 6B is a schematic cross-sectional view illustrating an inclination of a principal ray in a sub-pixel at a substantially central portion of a display surface.
Figure 6C:
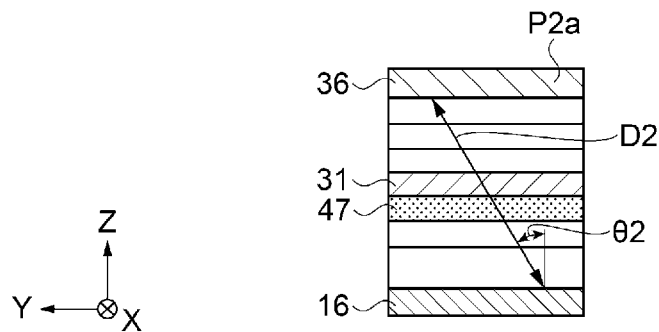
FIG. 6C is a schematic cross-sectional view illustrating an inclination of a principal ray in a sub-pixel at an end portion of a display surface.

FIG. 6A is a schematic diagram illustrating an optical system of a device that displays a virtual image. FIG. 6B is a schematic cross-sectional view illustrating an inclination of a principal ray in a sub-pixel at a substantially central portion of a display surface. FIG. 6C is a schematic cross-sectional view illustrating an inclination of a principal ray in a sub-pixel at an end portion of a display surface. FIG. 6A is a side view of an optical system 90 along the direction of travel of the image light. The optical system 90 is an optical system capable of being installed in a camera viewfinder or a HMD. In the present embodiment, an optical system of a HMD will be described.

As illustrated in FIG. 6A, the optical system 90 includes a display device 92 and an eyepiece lens 95. The display device 92 is an organic EL panel, and the planar size is smaller than the planar area of the eyepiece lens 95. The display device 92 is given a small size and light weight to allow the head portion to be more easily installed in a HMD. The eyepiece lens is a convex lens.

The image displayed on the display device 92 is magnified by the eyepiece lens 95 and is incident on an eye EY as image light. The image light is a light beam centered on an optical axis K extending perpendicularly from the center of a display surface E of the display device 92, widening from the display surface E and begins to converge at the eyepiece lens 95 and incident on the eye EY. The optical axis K is a straight line that passes through the center of the eyepiece lens 95 from the center of the display surface E to the center of the eye EY.

By the eye EY, a virtual image formed by the image light magnified by the eyepiece lens 95 is visually recognized. Note that various other lenses, light-guiding plates, and the like may be provided between the eyepiece lens 95 and the eye EY.

In the optical system 90, to produce a large virtual image, an angle of view F must be made larger. To increase the angle of view F using the display device 92 having a smaller planar area than the eyepiece lens 95, the angle of the principal ray needs to be increased.

The principal ray will be described now. The principal ray is, of the light beams emitted from the pixel, the light beam along the central axis mainly used in the employed optical system. For example, in a sub-pixel P1 positioned substantially in the center of the display surface E, the principal ray is a beam of light along the optical axis K, and an angle $\theta 1$, which is not illustrated, which is the inclination of the principal ray with respect to the optical axis K, is approximately 0°. Similarly, in a sub-pixel P2 located at an end portion of the display surface E in the +Y direction, the inclination of the principal ray is an angle $\theta 2$ that extends outward with respect to the optical axis K. Also, in a sub-pixel P3 located at an end portion of the display surface E in the −Y direction, the inclination of the principal ray is the angle $\theta 2$ that extends outward with respect to the optical axis K on the opposite side to that of the sub-pixel P2. Note that the angle $\theta 2$ depends on the application, but is generally approximately from 10° to 20°, for example.

To increase the angle of view F using the display device 92 having a smaller size, the angle of the principal ray of the sub-pixel located at the end portion side of the display surface needs to be increased. When the angle of the principal ray is increased, there is a problem in that chromaticity deviation occurs when the display device 92 is a known display device.

FIG. 6B schematically illustrates a cross section P1a, a cross section of the sub-pixel P1 in a substantially central portion of the display surface E. At the sub-pixel P1, the angle $\theta 1$ of the principal ray is approximately 0°. Thus, an optical path length D1 of the resonance structure is set to the length of the optical path length of one layer of an adjustment layer 47 on the basis of Formula (1). In the sub-pixel P1, chromaticity deviation does not occur. Note that the sub-pixels P1, P2, P3 are green pixels in the description.

FIG. 6C schematically illustrates a cross section P2a, a cross section of the sub-pixel P2 in an end portion of the display surface E. At the sub-pixel P2, the angle $\theta 2$ of the principal ray is greater than the angle $\theta 1$, but the optical path length is set in the same manner as the sub-pixel P1. Thus, the optical path length is an optical path length D2 that is longer than the optical path length D1. Accordingly, in setting an optical path length that satisfies the resonant condition for the optical path length D1, the principal ray is inclined to form the optical path length D2, and thus chromaticity deviation occurs due to a wavelength different from the desired wavelength resonating.

1.5. Adjustment of Optical Path Length

Figure 7:
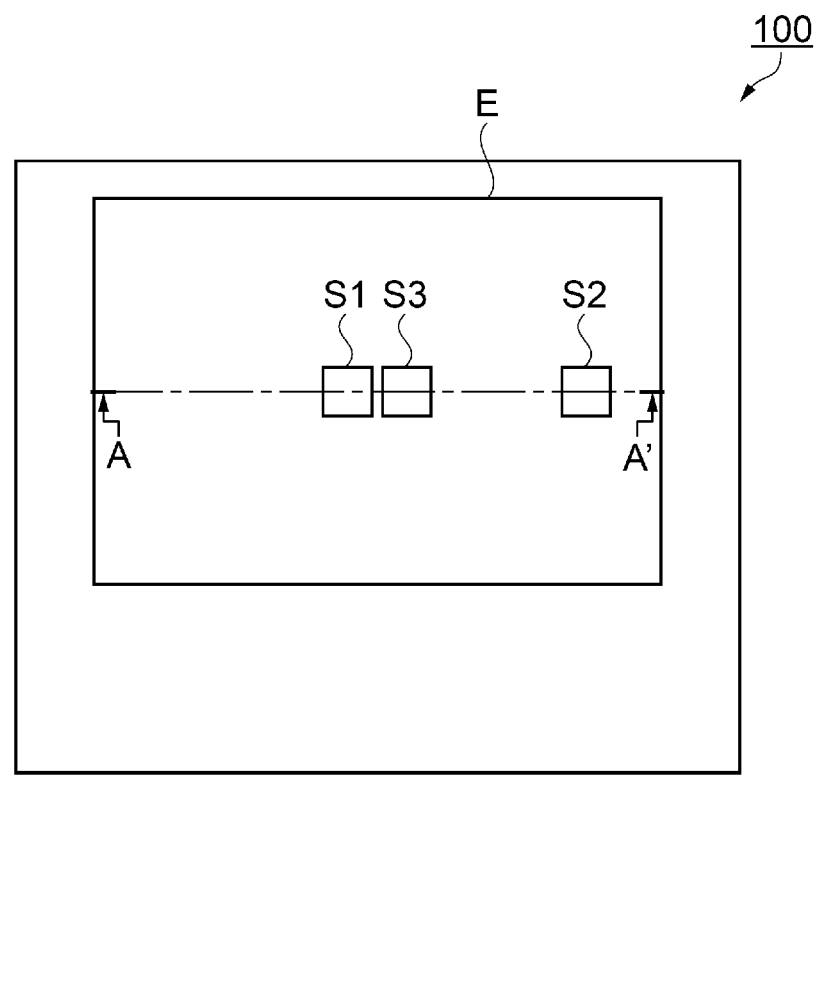
FIG. 7 is a plan view illustrating the arrangement of specific sub-pixels in a display region.

The configuration of the optical path length adjustment and the effect thereof in the organic EL device 100 of the present embodiment will be described with reference to FIGS. 7 to 10. FIG. 7 is a plan view illustrating the arrangement of specific sub-pixels in a display region. FIG.

Figure 8:
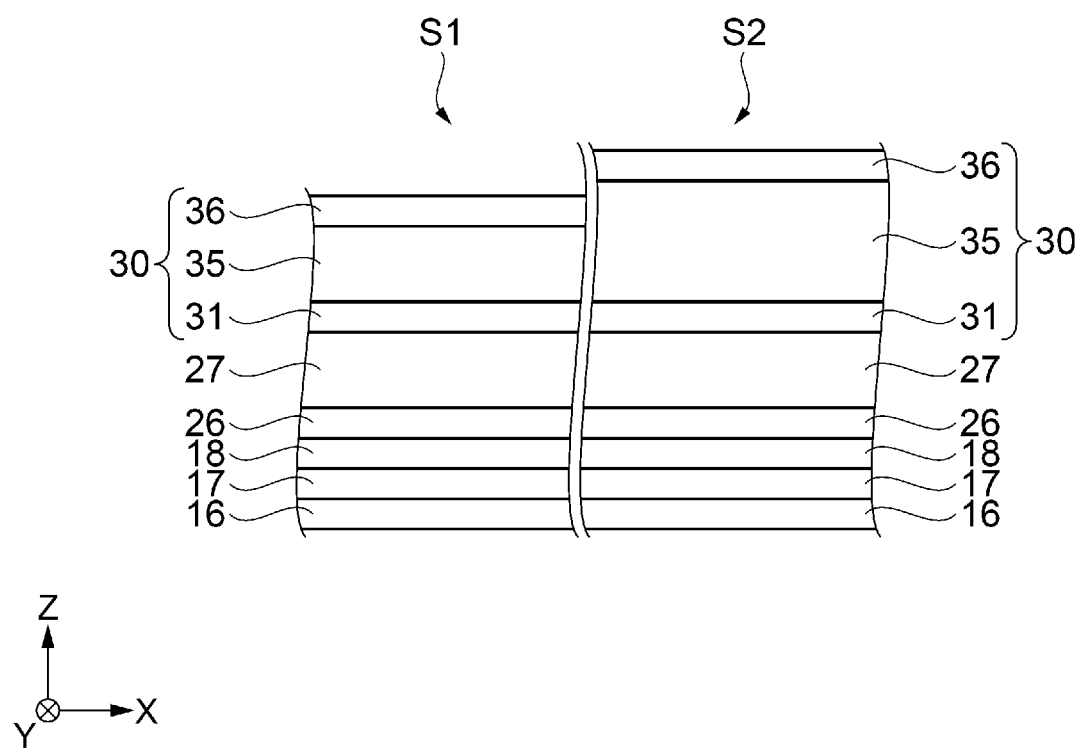
FIG. 8 is a schematic cross-sectional view of a first sub-pixel and a second sub-pixel.
Figure 9:
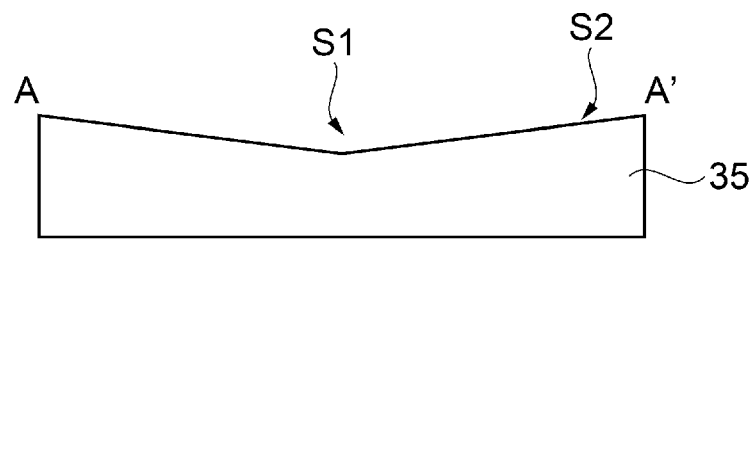
FIG. 9 is a schematic cross-sectional view illustrating the thickness of a functional layer.
Figure 10:
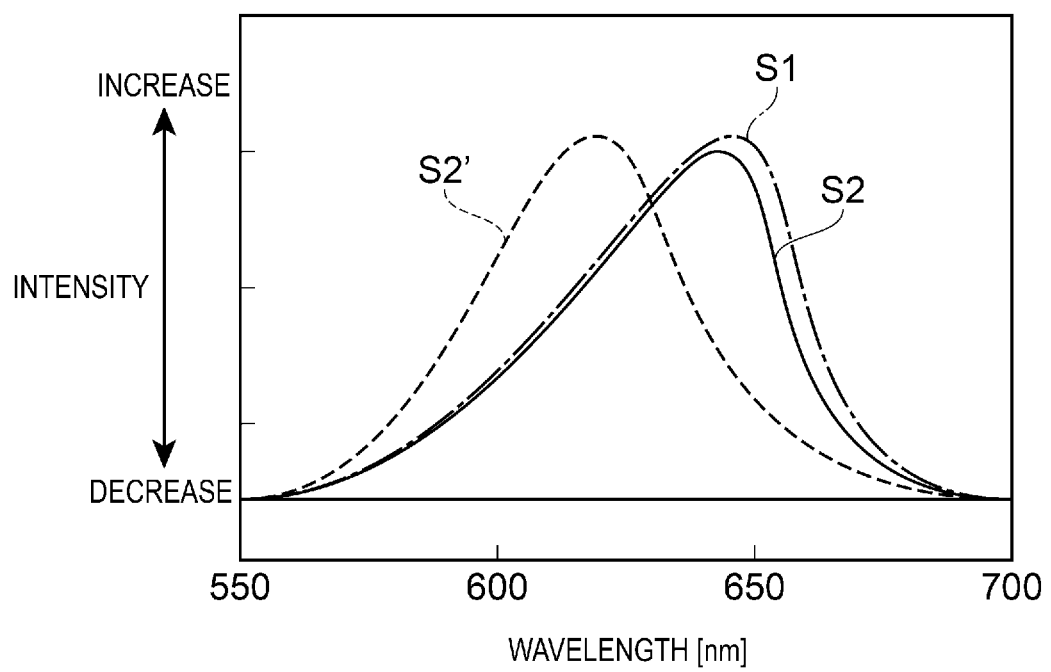
FIG. 10 is a graph illustrating the spectrum of light emitted in a simulation.

8 is a schematic cross-sectional view of a first sub-pixel and a second sub-pixel. FIG. 9 is a schematic cross-sectional view illustrating the thickness of a functional layer. FIG. 10 is a graph illustrating the spectrum of light emitted in a simulation. Here, FIGS. 8 and 9 illustrate a cross section taken along A-A' in FIG. 7. Note that in FIG. 8, only the configuration of the light-emitting pixel 20 from the reflection electrode 16 to the cathode 36 along the ±Z direction is illustrated. Also, in FIG. 9, the functional layer 35 is schematically illustrated, and the projections and depressions due to a difference in layer thickness of the adjustment layers 27 between the light-emitting pixels 20 of different colors are omitted.

As described above, the organic EL device 100 includes the plurality of light-emitting pixels 20 in the display region E. As illustrated in FIG. 7, the plurality of light-emitting pixels 20 include a first sub-pixel S1 and a second sub-pixel S2. The first sub-pixel S1 is disposed in the central area of the display region E in a plan view. The second sub-pixel S2 is disposed in a peripheral area outside of the central area. The plurality of light-emitting pixels 20 also include a third sub-pixel S3. Similar to the first sub-pixel S1, the third sub-pixel S3 is disposed in the central area of the display region E in a plan view. Hereinafter, the central area of the display region E in a plan view is referred to simply as the central area, and the peripheral area outside of the central area is referred to simply as the peripheral area.

Here, the first sub-pixel S1 is any one of the light-emitting pixels 20R, 20G including the adjustment layer 27 illustrated in FIG. 4, and the second sub-pixel S2 is a light-emitting pixel 20 that is the same color as the first sub-pixel S1. Accordingly, the wavelength region of light emitted from the resonance structure described above in the first sub-pixel S1 and the second sub-pixel S2 is the same first wavelength region. The third sub-pixel S3 is a light-emitting pixel 20 having a color different from that of the first sub-pixel S1. In the present embodiment, the first sub-pixel S1 and the second sub-pixel S2 are the light-emitting pixels 20R, and the third sub-pixel S3 is the light-emitting pixel 20B. Here, the first wavelength region is approximately in the range of from 580 nm to 750 nm, which is the wavelength region of red light.

Note that in the present embodiment, the first sub-pixel S1 and the second sub-pixel S2 are the light-emitting pixels 20R, but not such limitation is intended. The first sub-pixel S1 and the second sub-pixel S2 may be the light-emitting pixels 20G including the adjustment layer 27 or may be the light-emitting pixels 20B not having the adjustment layer 27. In the case where the first sub-pixel S1 and the second sub-pixel S2 are light-emitting pixels 20G, the first wavelength region is approximately in the range of from 495 nm to 570 nm, which is the wavelength region of green light. In the case where the first sub-pixel S1 and the second sub-pixel S2 are light-emitting pixels 20B, the first wavelength region is approximately in the range of from 430 nm to 495 nm, which is the wavelength region of blue light.

As illustrated in FIG. 8, the first sub-pixel S1 and the second sub-pixel S2 have the same layer configuration, but the layer thicknesses of the functional layers 35 are different. In other words, the thickness of the functional layer 35 in the second sub-pixel S2 is greater than the thickness of the functional layer 35 in the first sub-pixel S1. The thickness of the adjustment layer 27 in the first sub-pixel S1 and the second sub-pixel S2 is the same. Although not illustrated, in the third sub-pixel S3, the thickness of the functional layer 35 is the same as the thickness of the functional layer 35 of the first sub-pixel S1, and the thickness of the adjustment layer 27 is different from the thickness of the adjustment layer 27 of the first sub-pixel S1 and the second sub-pixel S2.

As illustrated in FIG. 9, the thickness of the functional layer 35 increases from the central area where the first sub-pixel S1 is disposed toward both ends in the ±X direction. Also, though not illustrated in the drawings, the thickness of the functional layer 35 increases from the central area toward both ends in the ±Y direction, as seen in a cross section along the YZ plane including the central area. The difference in thickness of the functional layer 35 between the central area and the outer edge of the display region E, including both ends in the ±X direction and the ±Y direction, is approximately from 2 nm to 20 nm. Note that the difference in layer thickness between the central area and the peripheral area of the functional layer 35 is not limited to being set in the ±X direction and the ±Y direction. The difference in the layer thickness described above may be set using only the ±X direction or the ±Y direction.

The difference in thickness between the functional layers 35 is set by adjusting the thickness of one or more layers of the plurality of layers of the functional layer 35 described above. Among the plurality of layers, the hole injecting layer 32 or the electron transport layer 34 is preferably adjusted. By adjusting the difference in thickness of the functional layers 35 by adjusting the hole injecting layer 32 or the electron transport layer 34, productivity and yield can be improved in the manufacturing process of the functional layer 35.

Specifically, the hole injecting layer 32 and the electron transport layer 34 are provided in contact with the cathode 36 or the pixel electrode 31 and are the first or last layer formed in the process of forming the functional layer 35. Thus, when the thickness of layer intermediately located in the plurality of layers of the functional layer 35 is adjusted, a mask application/removal operation for adjusting the layer thickness is required partway through the process. Accordingly, when the hole injecting layer 32 or the electron transport layer 34 is used, the mask application/removal operation is not complicated, and dust produced by the mask replacement operation is suppressed. A known organic material is used as the material for forming the hole injecting layer 32 and the electron transport layer 34.

When an electron injecting layer is provided on the functional layer 35, the difference in thickness described above is preferably adjusted by adjusting the hole injecting layer 32 or an electron injecting layer. The electron injecting layer (not illustrated) is disposed between the cathode 36 and the electron transport layer 34. Thus, the electron injecting layer is the last layer formed in the process of forming the functional layer 35. Thus, as described above, productivity and yield can be improved in the manufacturing process of the functional layer 35. An inorganic material such as fluoride, oxide, or the like of alkali metal or alkaline earth metal is used as the forming material of the electron injecting layer.

Also, the organic light-emitting layer 33 is typically formed by co-vapor deposition using a plurality of forming materials. In contrast, since the electron injecting layer is formed by vapor deposition using a single forming material, the thickness of the layer is easier to adjust. The hole injecting layer 32 and the electron transport layer 34 may be formed from a single material or a plurality of materials. Even when the hole injecting layer 32 and the electron transport layer 34 are formed by the vapor deposition of a single material, the thickness of the layer can be easily adjusted. Furthermore, the thickness difference of the functional layers 35 is preferably adjusting using the electron injecting layer because it is possible to suppress chromaticity deviation while suppressing variations in the chromaticity and brightness of the light emitted from the organic light-emitting layer 33.

FIG. 10 is a magnified view of a portion of the spectrum of emitted light obtained in a simulation, where the first sub-pixel S1 and the second sub-pixel S2 are light-emitting pixels 20R. In FIG. 10, the horizontal axis is the wavelength of light, and the vertical axis is the intensity of light. The dot-dash line indicates the spectrum of light emitted from the first sub-pixel S1, and corresponds to a case where the angle θ1 of the principal ray described above is approximately 0°. The solid line indicates the spectrum of light emitted from the second sub-pixel S2, and corresponds to a case where the angle θ2 of the principal ray described in FIG. 6C is approximately 25°. The dashed line corresponds to a comparative example in which the difference in thickness of the functional layer 35 described above is not set, and is used as a reference derived from a known organic EL device. For the comparative example, the spectrum of light emitted from a sub-pixel S2' of a known organic EL device in a position corresponding to the second sub-pixel S2 is illustrated. The dashed line also corresponds to a case where the angle θ2 of the principal ray described in FIG. 6C is approximately 25°. Although not illustrated in the drawings, in the known organic EL device described above, the spectrum of light emitted in a case where the angle θ1 of the principal ray is approximately 0° is the same as the spectrum of light emitted from the first sub-pixel S1.

As illustrated in FIG. 10, the spectrum of light emitted from the second sub-pixel S2 is substantially the same as that of the first sub-pixel S1 even though the angle θ2 of the principal ray is 25°. In particular, the peak wavelength of the spectrum of light emitted from the second sub-pixel S2 is substantially equal to the peak wavelength of the spectrum of light emitted from the first sub-pixel S1. In other words, in the second sub-pixel S2, the chromaticity deviation with respect to the first sub-pixel S1 is suppressed.

In contrast, the spectrum of light emitted from the sub-pixel S2' of the known organic EL device, i.e., the comparative example, is shifted toward the low wavelength side with respect to the spectrum of light emitted from the first sub-pixel S1. That is, in the sub-pixel S2', chromaticity deviation occurs with respect to the first sub-pixel S1, thus a known organic EL device has inferior visual field angle characteristics compared to the organic EL device 100.

1.6. Method for Manufacturing Organic EL Device

Figure 11:
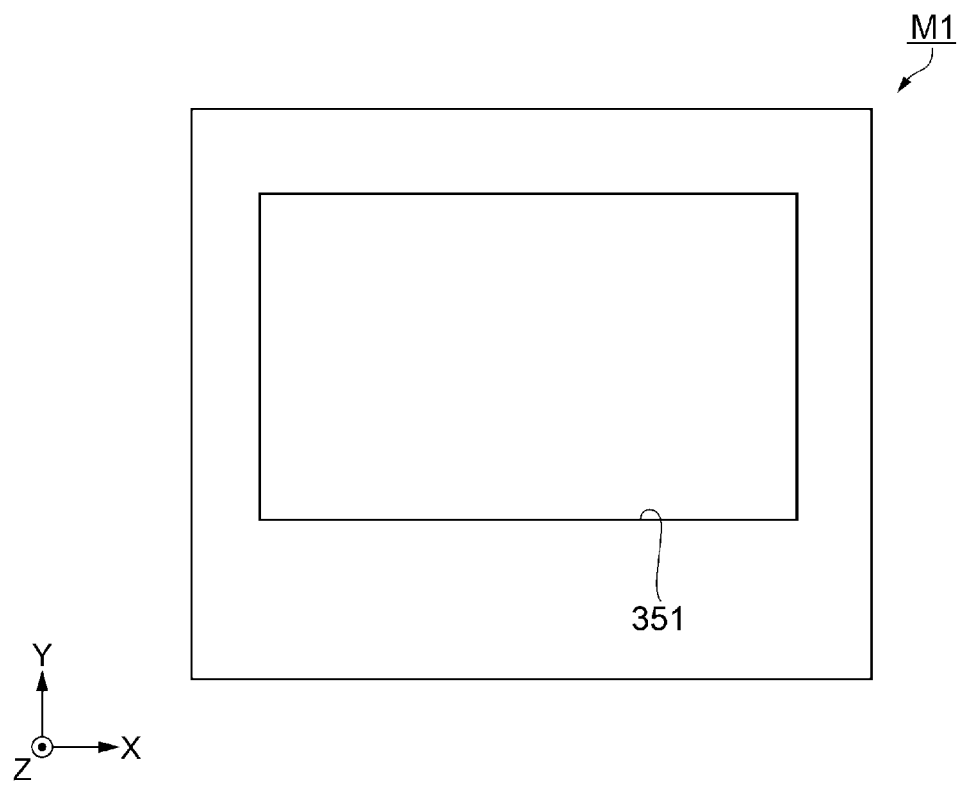
FIG. 11 is a plan view illustrating the appearance of an opening defining mask, i.e., a first mask.
Figure 12:
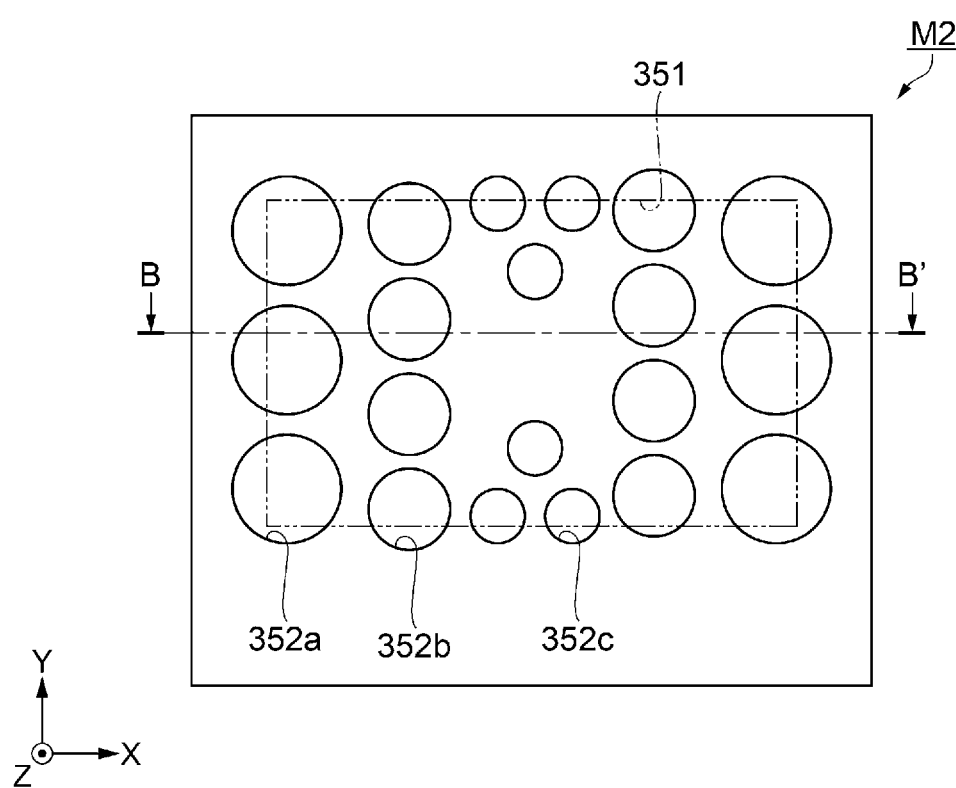
FIG. 12 is a plan view illustrating the appearance of a layer thickness adjustment mask, i.e., a second mask.
Figure 13A:
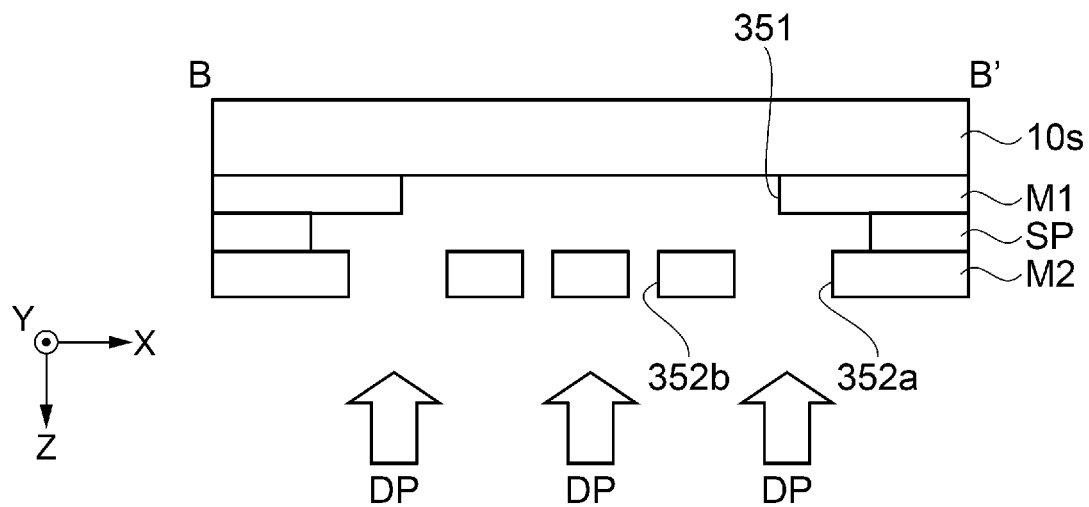
FIG. 13A is a schematic cross-sectional view illustrating a method for forming a functional layer.
Figure 13B:
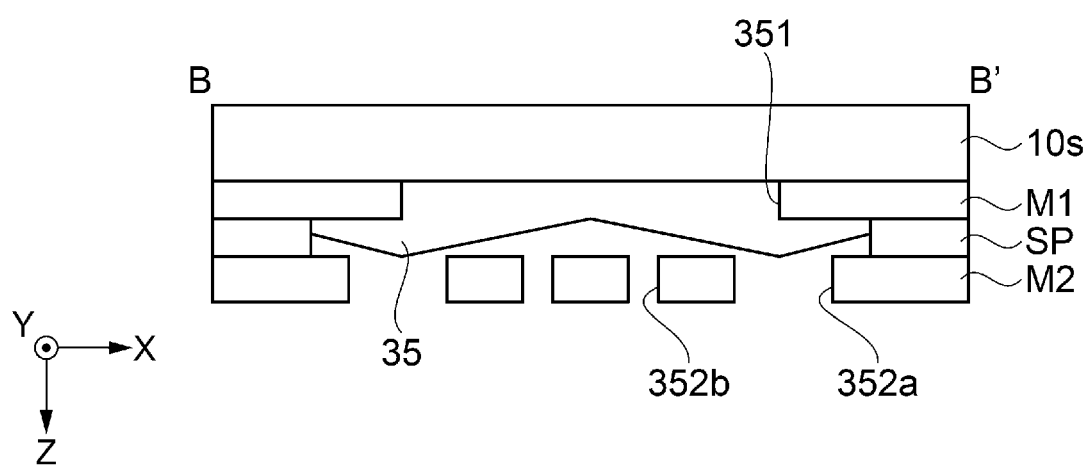
FIG. 13B is a schematic cross-sectional view illustrating a method for forming a functional layer.
Figure 13C:
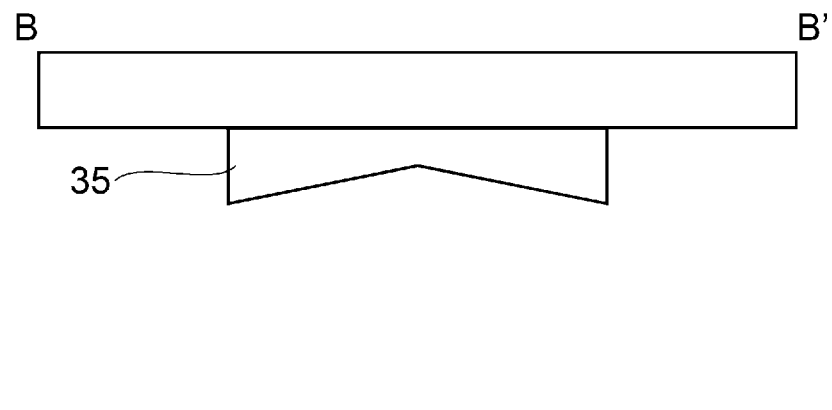
FIG. 13C is a schematic cross-sectional view illustrating a method for forming a functional layer.

A method for manufacturing the organic EL device 100, i.e., a light-emitting device, of the present embodiment will be described with reference to FIG. 11, FIG. 12, FIG. 13A, FIG. 13B, and FIG. 13C. FIG. 11 is a plan view illustrating the appearance of an opening defining mask, i.e., a first mask. FIG. 12 is a plan view illustrating the appearance of a layer thickness adjustment mask, i.e., a second mask. FIGS. 13A, 13B, 13C are schematic cross-sectional views illustrating a method for forming a functional layer. FIGS. 13A, 13B, 13C are views of a cross section along line B-B' in FIG. 12. Layers below the functional layer 35 formed above the substrate 10s are omitted. Note that in the following description, reference is also made to FIG. 4.

The method for manufacturing the organic EL device 100 of the present embodiment includes a method of manufacturing the element substrate 10. Known techniques other than the processes in the method for manufacturing the element substrate 10 may be used. Also, one characteristic portion of the present disclosure is a process for forming the functional layer 35 on the element substrate 10. Thus, hereinafter, only the method for forming the functional layer 35 will be described. Note that in the method for manufacturing the element substrate 10, a known technique can be employed unless otherwise specified.

The organic EL device 100 includes the plurality of sub-pixels including the first sub-pixel S1 and the second sub-pixel S2 arranged in a matrix-like pattern in the display region E. As illustrated in FIG. 4, each of the plurality of sub-pixels includes the reflection electrode 16 as a reflection layer, the adjustment layer 27 as an insulating film, the pixel electrode 31, the functional layer 35 as a light-emitting functional layer, and the cathode 36 as a semi-transmissive reflection layer. Also, the plurality of sub-pixels include a resonance structure in which light emitted by the functional layer 35 resonates between the reflection electrode 16 and the cathode 36.

A method for manufacturing the organic EL device 100 of the present embodiment includes forming the functional layer 35 by a vapor deposition method using an opening defining mask M1 as the first mask and a layer thickness adjustment mask M2 as the second mask, which will be described later. As illustrated in FIG. 11, the opening defining mask M1 that defines the display region E is a substantially frame-shaped plate and includes a window portion 351 having a shape substantially the same as that of the display region E in a plan view. That is, the arrangement and shape of the window portion 351 of the opening defining mask M1 defines the arrangement and shape of the functional layer 35. A known metal mask of stainless steel or the like can be used for the opening defining mask M1.

As illustrated in FIG. 12, the layer thickness adjustment mask M2 has a flat plate shape and includes a plurality of opening portions 352a, 352b, 352c which are substantially circular in a plan view. The plurality of opening portions 352a, 352b, 352c are disposed in regions substantially overlapping with the window portion 351 of the opening defining mask M1. Hereinafter, the opening portions 352a, 352b, 352c are referred to simply as the opening portion 352. The plurality of opening portions 352 are more densely provided in the peripheral area of the central area, which is a region corresponding to the second sub-pixel S2, than the central area of the display region E in a plan view, which is a region corresponding to the first sub-pixel S1.

Specifically, the number of the plurality of opening portions 352 disposed in the central area is low, and the number of the plurality of opening portions 352 disposed in the peripheral area is high. Also, the planar area, i.e., the size, of the opening portions 352a, 352b, 352c varies. Specifically, the diameter of the openings increases in order from the opening portion 352c to the opening portion 352b to the opening portion 352a. Relative to the diameter of the opening portion 352a, the diameter of the opening portion 352b is approximately ⅔, and the diameter of the opening portion 352c is approximately ½. The opening portion 352c is disposed near the central area, the opening portion 352a is disposed in the peripheral area, and the opening portion 352b is disposed between the central area and the peripheral area. A known metal mask of stainless steel or the like can be used for the layer thickness adjustment mask M2.

The layer thickness adjustment mask M2 with the above-described configuration provides a difference in the density of the openings for each of the above-described areas. As a result, the thickness of the functional layer 35 can be made thick in the central area and thinner in the peripheral area.

In the layer thickness adjustment mask M2 of the present embodiment, a difference in the density of the openings per area is made by the number and the size of the opening portions 352, but this difference may be made only the number or the size of the opening portions 352. The planar shape of the opening portion 352 is not limited to a substantially circular shape, and may be an oval, a polygon, a slit, or an irregular shape, or a combination of different shapes may be used for the opening portion 352. Furthermore, the number and individual sizes of the plurality of opening portions 352 are not limited to the configurations described above. Also, in order to provide the opening portions 352, the layer thickness adjustment mask M2 may be formed from a metal mesh.

Next, a method for forming the functional layer 35 using the opening defining mask M1 and the layer thickness adjustment mask M2 will be described. As illustrated in FIG. 13A, in the process of forming the functional layer 35, the opening defining mask M1 is disposed on the substrate 10s side, and the layer thickness adjustment mask M2 is disposed overlapping the opening defining mask M1 with a spacer SP therebetween.

The spacer SP is a frame-shaped plate including an opening portion larger than the window portion 351 of the opening defining mask M1. The shape of the spacer SP is not limited to the configuration described above. The spacer SP is used to adjust the layer thickness of the functional layer 35, but the spacer SP need not be used in a case where the desired layer thickness of the functional layer 35 can be ensured with only the opening defining mask M1 and the layer thickness adjustment mask M2.

Vapor depositing on the substrate 10s is performed from the layer thickness adjustment mask M2 side with the opening defining mask M1, the spacer SP, and the layer thickness adjustment mask M2 disposed overlapping one another. Specifically, the forming material of functional layer 35 is vaporized or sublimated to produce the vaporized particles DP. Then, the vaporized particles DP are deposited on the substrate 10s through the opening portion 352 of the layer thickness adjustment mask M2 and the window portion 351 of the opening defining mask M1. Here, since the layer thickness adjustment mask M2 has the opening density described above, the vaporized particles DP are not deposited uniformly in a plan view. That is, depending on the opening density of the layer thickness adjustment mask M2, a difference occurs in the deposited amount of the vaporized particles DP, and this difference is the difference in the layer thickness of the functional layer 35.

In this manner, the functional layer 35 is formed as illustrated in FIG. 13B. In the display region E, the functional layer 35 is formed with a thick layer thickness in the central area and a thin layer thickness in the peripheral area. Note that, at this stage, the functional layer 35 extends to a region outside of the display region E in a plan view.

Next, the functional layer 35 is subjected to etching or the like as illustrated in FIG. 13C to form the planar shape of the functional layer 35 into a shape corresponding to the display region E. Here, the functional layer 35 with a difference in layer thickness in a plan view is preferably the hole injecting layer 32 or the electron transport layer 34 illustrated in FIG. 5. In the present embodiment, because the layer thickness difference is provided via the hole injecting layer 32, the organic light-emitting layer 33 and the electron transport layer 34 are formed without a layer thickness difference without using the layer thickness adjustment mask M2.

According to the present embodiment, the following advantages can be obtained.

The organic EL device 100 has improved visual field angle characteristics. Specifically, the thickness of the functional layer 35 in the second sub-pixel S2 is greater than the thickness of the functional layer 35 in the first sub-pixel S1. That is, in the display region E, the optical path length, which is the optical distance in the resonance structure, is changed between the central area and the peripheral area. Thus, even when the angle of view is larger in the peripheral area with respect to the central area, the optical path length can be adjusted by actively changing the optical path length, and the offset in the resonant wavelength can be corrected. As a result, chromaticity deviation can be suppressed. Thus, a light-emitting device having improved visual field angle characteristics can be provided.

The optical path length in the resonance structure is adjusted by first layer thickness of the adjustment layer 27, i.e., the insulating film. Thus, the light emitted from the resonance structure can be enhanced by constructive interference to improve the extraction efficiency of the light.

The optical path length in the resonance structure is changed by the first sub-pixel S1, the second sub-pixel S2, and the third sub-pixel S3. Thus, light of different resonant wavelengths can be extracted by the first sub-pixel S1, the second sub-pixel S2, and the third sub-pixel S3.

The vaporized particles DP of the forming material of the functional layer 35 are deposited via the plurality of opening portions 352 in the layer thickness adjustment mask M2. Then, the functional layer 35 can be formed thicker in the peripheral area corresponding to the second sub-pixel S2 in comparison to the central area corresponding to the first sub-pixel S1 by adjusting the opening density of the plurality of opening portions 352. In other words, the organic EL device 100 having improved visual field angle characteristics can be manufactured.

2. Second Embodiment

In the present embodiment, a method for manufacturing an organic EL device, i.e., a light emitting device, is described in a similar manner as in the first embodiment. This light-emitting device can be used in an electronic apparatus such as a HMD. Note that the method for manufacturing the organic EL device according to the present embodiment differs from the first embodiment in that the form of the layer thickness adjustment mask, i.e., the second mask, used in forming the functional layer is different. Thus, the same components as in the first embodiment are given the same reference number, and redundant descriptions of these components will be omitted.

2.1. Layer Thickness Adjustment Mask

A plurality of forms of a layer thickness adjustment mask according to the present embodiment will be described with reference to FIGS. 14 to 17. FIGS. 14 to 17 are plan views illustrating the appearance of a layer thickness adjustment mask, i.e., the second mask, according to the second embodiment. In FIGS. 14 to 17, only the region corresponding to the display region E of the layer thickness adjustment mask is illustrated. Also, in FIGS. 14 to 17, the mesh hole size, i.e., the density of the plurality of opening portions, of the metal mesh described below is represented by shade gradation. Specifically, in FIGS. 14 to 17, the larger the mesh hole size, the lighter the gradation, and the smaller the mesh hole size, the darker the gradation. Note that in the following description, the state is described in a plan view unless otherwise indicated.

Figure 14:
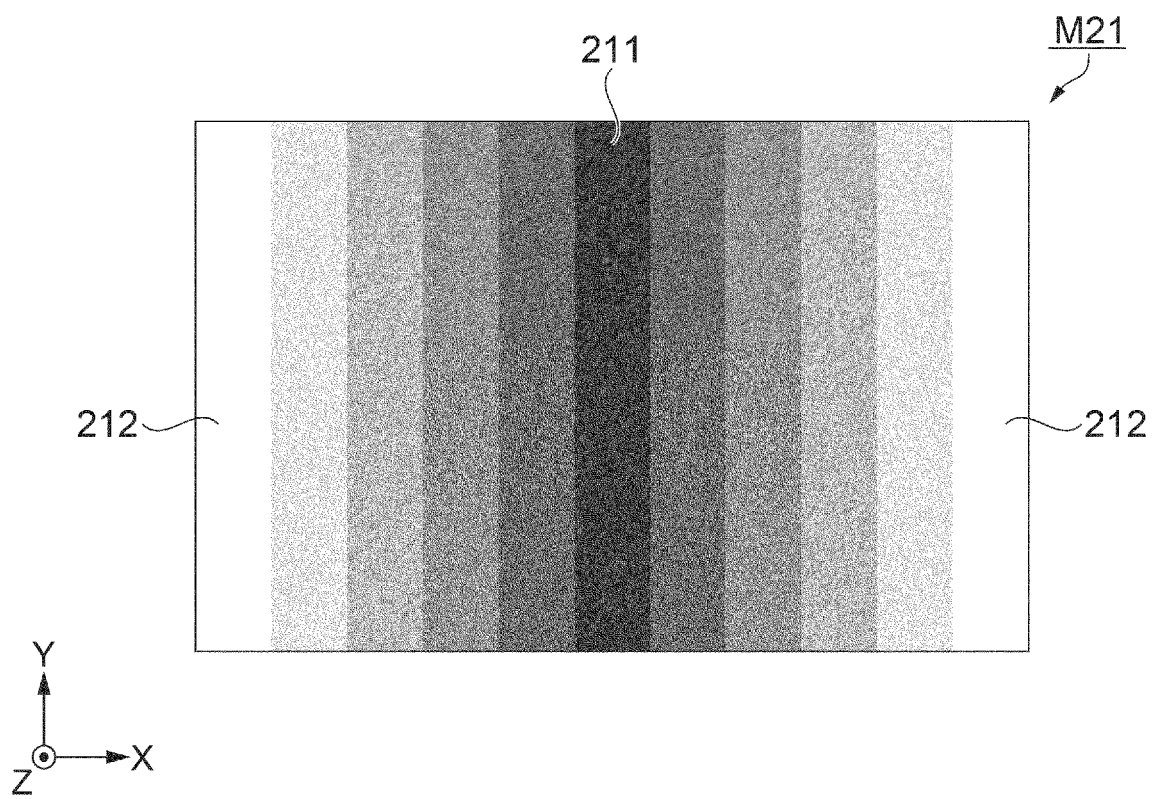
FIG. 14 is a plan view illustrating the appearance of a layer thickness adjustment mask, i.e., a second mask, according to a second embodiment.

As illustrated in FIG. 14, a layer thickness adjustment mask M21, which is an example of the second mask of the present embodiment, is formed from a flat metal mesh. The metal mesh includes a plurality of opening portions, i.e., mesh openings that are not illustrated. The metal mesh can be, for example, a stainless steel wire mesh and the like.

The layer thickness adjustment mask M21 includes a plurality of areas including an area 211 and an area 212. The plurality of areas each have a rectangular shape and are arranged side by side in the ±X direction, forming a divide the layer thickness adjustment mask M21 in the ±Y direction.

In the layer thickness adjustment mask M21, the region corresponding to the first sub-pixel S1 is the area 211, and the region corresponding to the second sub-pixel S2 is the area 212. The area 211 has a smaller mesh hole size than the area 212. Also, the mesh hole size of the metal mesh increases from the area 211 toward the area 212 in a step-like manner.

According to the configuration above, using the layer thickness adjustment mask M21, the layer thickness of the functional layer 35 is increased from the first sub-pixel S1 toward the second sub-pixel S2 due to the difference in mesh hole size in the metal mesh. Note that the layer thickness adjustment mask M21 does not produce a difference in the layer thickness of the functional layer 35 in the ±Y direction.

Next, layer thickness adjustment masks M22, M23, M24, which are further examples of the second mask of the present embodiment, will be described.

Figure 15:
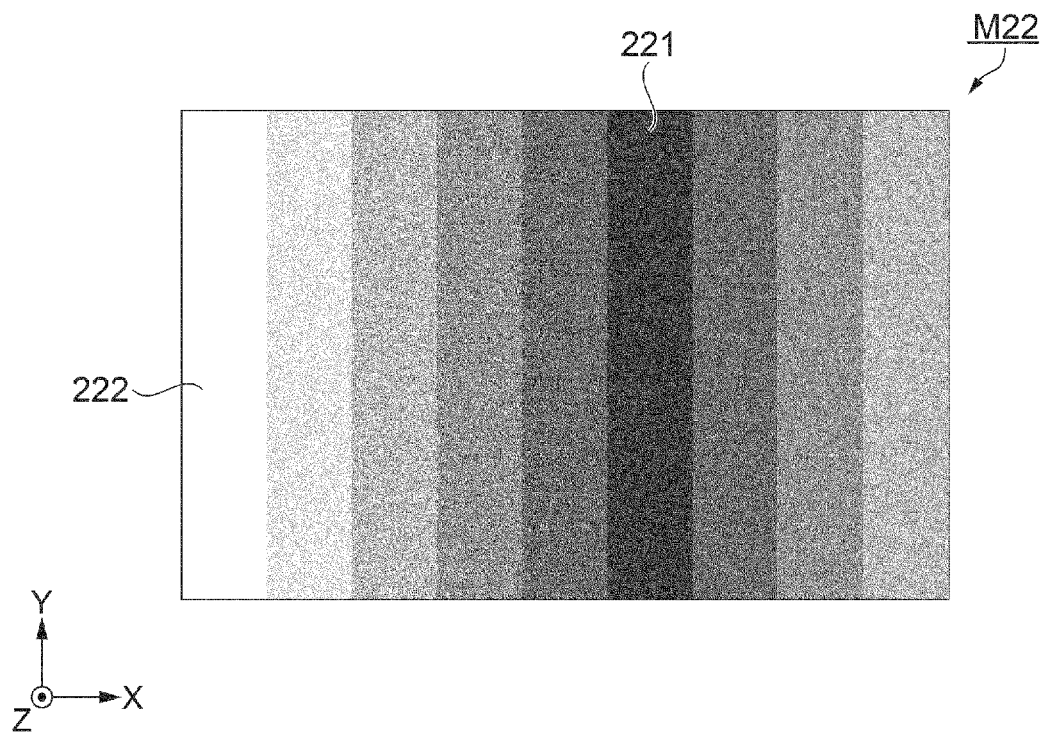
FIG. 15 is a plan view illustrating the appearance of a layer thickness adjustment mask.

As illustrated in FIG. 15, the layer thickness adjustment mask M22 includes a plurality of areas including an area 221 and an area 222. Similar to the layer thickness adjustment mask M21, the plurality of areas have a rectangular shape along the ±Y direction in the longitudinal direction. The layer thickness adjustment mask M22 differs from the layer thickness adjustment mask M21 in that the area 221, which is the region corresponding to the first sub-pixel S1, is offset in the +X direction. The region corresponding to the second sub-pixel S2 is the area 222.

Figure 16:
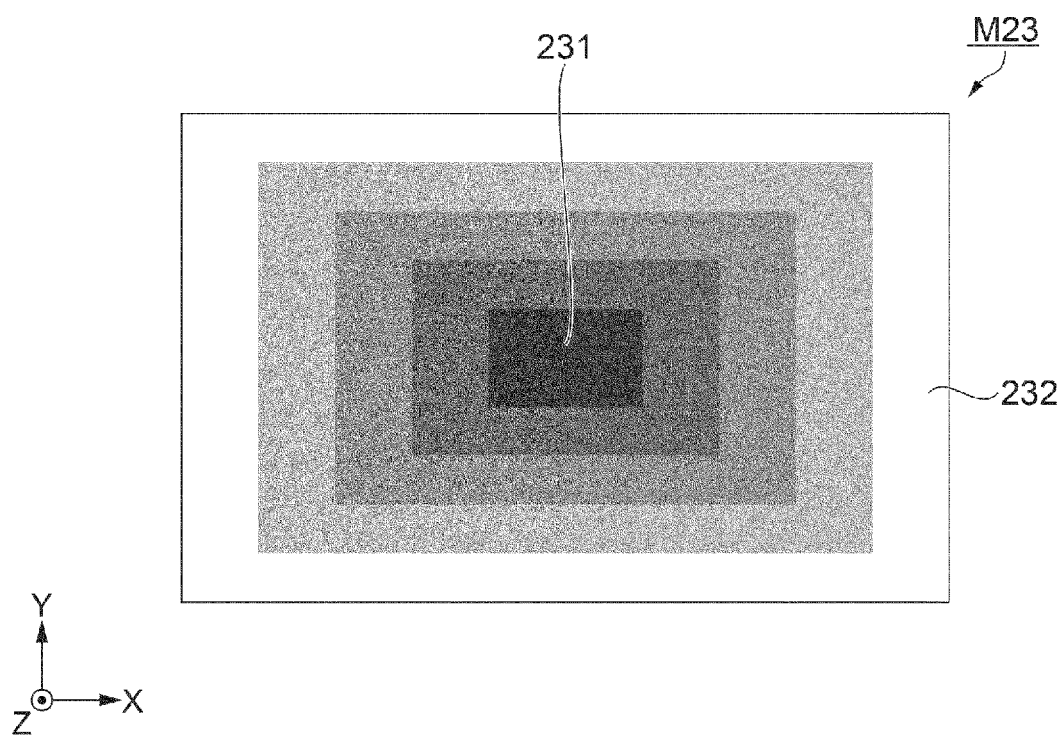
FIG. 16 is a plan view illustrating the appearance of a layer thickness adjustment mask.

As illustrated in FIG. 16, the layer thickness adjustment mask M23 includes a plurality of areas including an area 231 and an area 232. The plurality of areas are formed in a substantially rectangular frame shape except for the area 231 corresponding to the first sub-pixel S1. The area 231 is formed substantially in the center of the layer thickness adjustment mask M23 and is formed in a rectangular shape. The region corresponding to the second sub-pixel S2 is the area 232, and the area 232 is disposed on the periphery of the layer thickness adjustment mask M23. The mesh hole size of the metal mesh increases from the area 231 toward the area 232 in a step-like manner.

Figure 17:
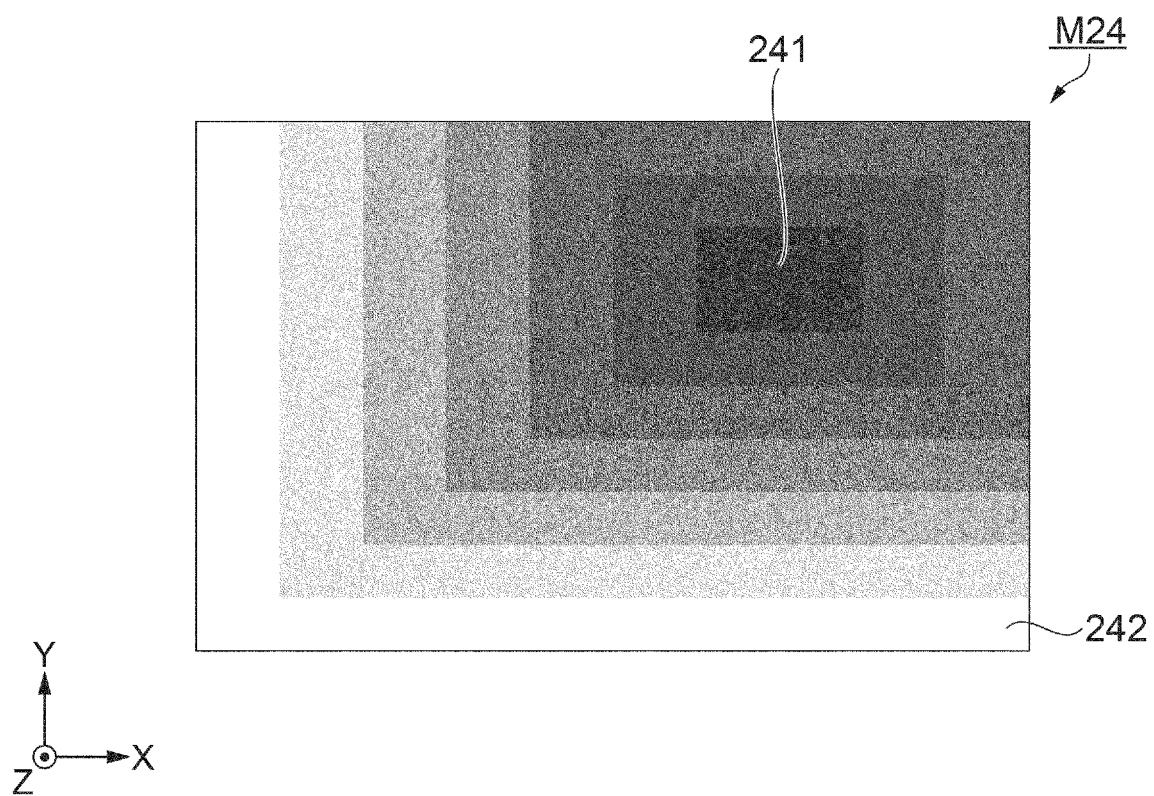
FIG. 17 is a plan view illustrating the appearance of a layer thickness adjustment mask.

As illustrated in FIG. 17, the layer thickness adjustment mask M24 includes a plurality of areas including an area 241 and an area 242. The layer thickness adjustment mask M24 differs from the layer thickness adjustment mask M23 in that the area 241, which is the region corresponding to the first sub-pixel S1, is offset in the +X direction and the +Y direction. The region corresponding to the second sub-pixel S2 is the area 242. The area 242 is provided along the periphery of two adjacent sides of the layer thickness adjustment mask M24 and forms a substantially L-like shape.

Here, the plurality of areas in the layer thickness adjustment mask, i.e., the second mask, are not limited to being rectangular or frame-shaped, and may be substantially circular or substantially elliptical. Also, the number and arrangement of the plurality of areas is not limited to the configurations described above. Furthermore, in the present embodiment, the mesh hole size of the metal mesh varies per area in a step-like manner, but no such limitation is intended.

According to the present embodiment, similar advantages to the above-described embodiment can be achieved.

3. Third Embodiment

Figure 18:
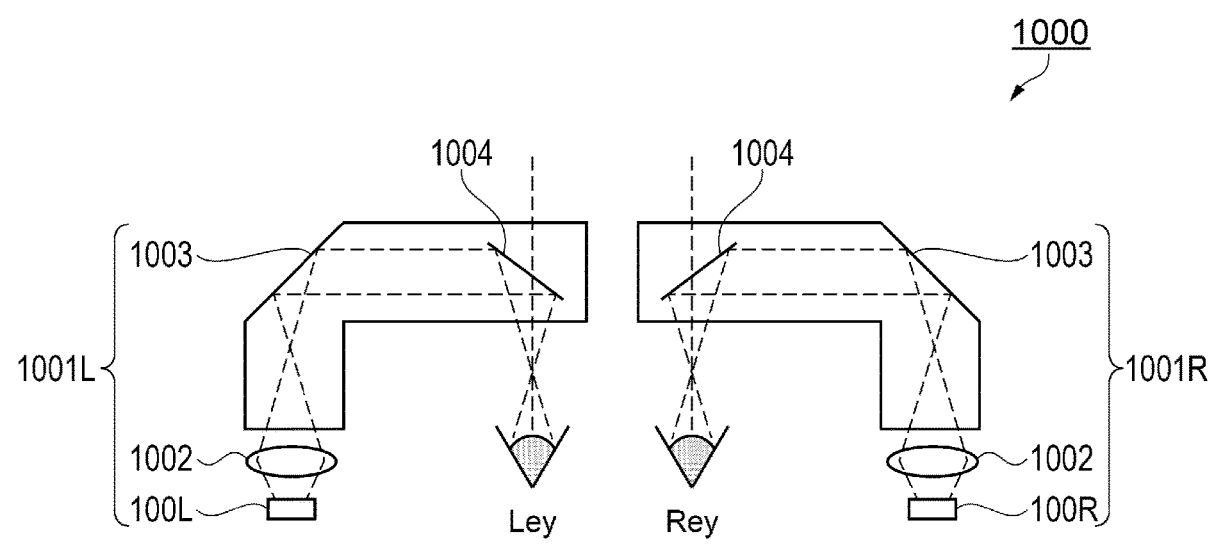
FIG. 18 is a schematic diagram illustrating a head-mounted display, i.e., electronic apparatus, according to a third embodiment.

In the present embodiment, a head-mounted display will be described as an example of the electronic apparatus. FIG. 18 is a schematic diagram illustrating the head-mounted display, i.e., electronic apparatus, according to the third embodiment.

As illustrated in FIG. 18, the head-mounted display 1000 of the present embodiment includes a pair of optical units 1001L, 1001R. Though not illustrated, the head-mounted display 1000 includes a power supply unit, a control unit, a mounting portion for mounting the head-mounted display 1000 to the head of a user, and the like. The pair of optical units 1001L, 1001R display information for the left and right eye, respectively, of a user. The pair of optical units 1001L, 1001R are configured to be left-right symmetrical, and thus the optical unit 1001R for a right eye Rey will be described in the example.

The optical unit 1001R includes a display unit 100R, a condenser optical system 1002, and a light guide 1003 with a bent shape. The condenser optical system 1002 and the light guide 1003 are disposed in this order in the direction display light travels from the display unit 100R. A half mirror layer 1004 is provided in the light guide 1003. With this arrangement, in the optical unit 1001R, display light emitted from the display unit 100R passes through the condenser optical system 1002, is incident on the light guide 1003, reflected at the half mirror layer 1004, then guided to the right eye Rey.

The display unit 100R can display a display signal transmitted from the control unit as image information, such as text and video. The image information displayed on the display unit 100R is converted from an actual image into a virtual image by the condenser optical system 1002 and is incident on the light guide 1003. The display unit 100R is an example of the organic EL device 100 of the embodiments described above.

The light guide 1003 includes a combination of rod lenses and forms a rod integrator. The display light incident on the light guide 1003 is totally reflected within the rod lens and transmitted to the half mirror layer 1004. The half mirror layer 1004 is disposed at an angle that reflects the light beam of the display light toward the right eye Rey.

The image, i.e., the display light incident on the half mirror layer 1004, is a virtual image. Thus, the user is able to view both the virtual image projected on the display unit 100R and the external scene beyond the half mirror layer 1004. That is, the head-mounted display 1000 is a see-through projection-type display device.

Here, the planar size of the display unit 100RR is set to be smaller than the planar size of the condenser optical system 1002. To produce a large virtual image with the small display unit 100R, the angle of view must be made larger. The display unit 100R is an example of the organic EL device 100 of the embodiments described above. Thus, chromaticity deviation is suppressed when the angle of view is made larger.

The optical unit 1001L for a left eye Ley includes a display unit 100L using the organic EL device 100 of the above-described embodiment, similar to the optical unit 1001R for the right eye Rey. The configuration and function of the optical unit 1001L are the same as the optical unit 1001R for the right eye Rey. Thus, the optical unit 1001L will not be described.

According to the present embodiment, the organic EL device 100, i.e., the light emitting device of the above-described embodiment, is mounted, so it is possible to provide the head-mounted display 1000 capable of display with excellent visual field angle characteristics.

Note that the head-mounted display 1000 including the organic EL device 100 of the present embodiment includes the pair of optical units 1001L, 1001R for both eyes, but no such limitation is intended. The head-mounted display 1000 may include only one of the two optical units 1001R, 1001L, for example. The head-mounted display 1000 is also not limited to being a see-through type, and may instead be an immersive type in which the image is viewed with outside light blocked.

The electronic apparatus including the organic EL device 100 of the embodiment described above is not limited to being a head-mounted display. The organic EL device 100 of the embodiments described above can be suitably used as a display unit, such as a head-up display (HUD), an electronic viewfinder (EVF), a portable information terminal, or the like.

Contents derived from the Embodiments will be described below.

A light-emitting device includes a first sub-pixel and a second sub-pixel disposed in a display region, the first sub-pixel and the second sub-pixel including a reflection layer, a semi-transmissive reflection layer, a light-emitting functional layer disposed between the reflection layer and the semi-transmissive reflection layer, the light-emitting device further including a resonance structure in which light emitted from the light-emitting functional layer resonates between the reflection layer and the semi-transmissive reflection layer, wherein in the first sub-pixel and in the second sub-pixel, a wavelength region of light emitted from the resonance structure is a first wavelength region, and a thickness of the light-emitting functional layer in the second sub-pixel is greater than a thickness of the light-emitting functional layer in the first sub-pixel.

A light-emitting device with this configuration has improved visual field angle characteristics. Specifically, a thickness of the light-emitting functional layer in the second sub-pixel is greater than a thickness of the light-emitting functional layer in the first sub-pixel. In other words, the optical path length is changed between the first sub-pixel and the second sub-pixel provided in the display region. Thus, even when the angle of view is large, the optical path length can be adjusted by actively changing the optical path length, and the offset in the resonant wavelength can be corrected. As a result, chromaticity deviation can be suppressed. Thus, a light-emitting device having improved visual field angle characteristics can be provided.

In the light-emitting device described above, preferably, the first sub-pixel and the second sub-pixel include a pixel electrode disposed between the reflection layer and the light-emitting functional layer and an insulating film having a first layer thickness and disposed between the reflection layer and the pixel electrode.

According to this configuration, the optical path length in the resonance structure is adjusted by first layer thickness of the insulating film. Thus, the light emitted from the resonance structure can be enhanced by constructive interference to improve the extraction efficiency of the light.

A light-emitting device includes a first sub-pixel, a second sub-pixel, and a third sub-pixel disposed in a display region, the first sub-pixel, the second sub-pixel, and the third sub-pixel including a reflection layer, a semi-transmissive reflection layer, a light-emitting functional layer disposed between the reflection layer and the semi-transmissive reflection layer, and an adjustment layer disposed between the reflection layer and the light-emitting functional layer, the light-emitting device further including a resonance structure in which light emitted from the light-emitting functional layer resonates between the reflection layer and the semi-transmissive reflection layer, wherein a thickness of the light-emitting functional layer in the second sub-pixel is greater than a thickness of the light-emitting functional layer in the first sub-pixel.

A light-emitting device with this configuration has improved visual field angle characteristics. Specifically, a thickness of the light-emitting functional layer in the second sub-pixel is greater than a thickness of the light-emitting functional layer in the first sub-pixel. In other words, the optical path length is changed between the first sub-pixel and the second sub-pixel provided in the display region. Thus, even when the angle of view is large, the optical path length can be adjusted by actively changing the optical path length, and the offset in the resonant wavelength can be corrected. As a result, chromaticity deviation can be suppressed. Thus, a light-emitting device having improved visual field angle characteristics can be provided.

In the light-emitting device described above, preferably, in the first sub-pixel and the light-emitting functional layer in the third sub-pixel have an equal thickness, the adjustment layer in the first sub-pixel and the adjustment layer in the second sub-pixel have an equal thickness, and the adjustment layer in the third sub-pixel has a different thickness from those of the adjustment layer in the first sub-pixel and the adjustment layer in the second sub-pixel.

According to this configuration, the optical path length in the resonance structure is changed by the first sub-pixel, the second sub-pixel, and the third sub-pixel. Thus, light of different resonant wavelengths can be extracted by the first sub-pixel, the second sub-pixel, and the third sub-pixel.

In the light-emitting device described above, preferably the first sub-pixel is disposed in a central area of the display region in plan view, and the second sub-pixel is disposed in a peripheral area outside of the central area.

According to this configuration, the optical path length in the resonance structure is changed by central area and the peripheral area. Thus, even when the angle of view is larger in the peripheral area with respect to the central area, the optical path length can be adjusted by actively changing the optical path length, and the offset in the resonant wavelength can be corrected. As a result, chromaticity deviation can be suppressed and visual field angle characteristics can be further improved.

An electronic apparatus includes the light-emitting device described above.

According to this configuration, by installing a light-emitting device with improved visual field angle characteristics, an electronic apparatus with improved display quality can be provided.

A method for manufacturing a light-emitting device including a first sub-pixel and a second sub-pixel disposed in a display region, the first sub-pixel and the second sub-pixel including a reflection layer, an insulating film, a pixel electrode, a light-emitting functional layer, a semi-transmissive reflection layer, the light-emitting device further including a resonance structure in which light emitted from the light-emitting functional layer resonates between the reflection layer and the semi-transmissive reflection layer, includes forming the light-emitting functional layer via a vapor deposition method using a first mask defining the display region and a second mask including a plurality of opening portions, wherein the first sub-pixel is disposed in a central area of the display region in plan view and the second sub-pixel is disposed in a peripheral area outside of the central area, and the plurality of opening portions of the second mask have a higher density in the peripheral area corresponding to the second sub-pixel than in the central area corresponding to the first sub-pixel.

According to this configuration, the vaporized particles of the forming material of the light-emitting functional layer are deposited via the plurality of opening portions in the second mask. Then, the light-emitting functional layer can be formed thicker in the peripheral area corresponding to the second sub-pixel in comparison to the first sub-pixel by adjusting the density of the plurality of opening portions. In other words, a light-emitting device having improved visual field angle characteristics can be manufactured.

What is claimed is:

1. A light-emitting device comprising:
   a semi-transmissive reflection layer;
   a first reflection layer that is disposed in a first sub-pixel;
   a second reflection layer that is disposed in a second sub-pixel, the second sub-pixel that emits same color light as the first sub-pixel; and
   a light-emitting functional layer that is disposed between the first reflection layer and the semi-transmissive reflection layer, and that is disposed between the second reflection layer and the semi-transmissive reflection layer, wherein
   a thickness of the light-emitting functional layer in the second sub-pixel is thicker than a thickness of the light-emitting functional layer in the first sub-pixel.

2. The light-emitting device according to claim 1, further comprising:
   a first pixel electrode that is disposed between the first reflection layer and the light-emitting functional layer;
   a second pixel electrode that is disposed between the second reflection layer and the light-emitting functional layer; and
   an insulating layer that is disposed between the first reflection layer and first pixel electrode, and that is disposed between the second reflection layer and the second pixel electrode, the insulating layer having a first thickness.

3. The light-emitting device according to claim 2, wherein the first sub-pixel is arranged in a center of a display region more than the second sub-pixel.

4. The light-emitting device according to claim 1, wherein the first sub-pixel is arranged in a center of a display region more than the second sub-pixel.

5. An electronic apparatus comprising the light-emitting device of claim 1.

6. A light-emitting device comprising:
   a first sub-pixel;
   a second sub-pixel; and
   a third sub-pixel, wherein
   the first sub-pixel, the second sub-pixel and the third sub-pixel includes:
   a reflection layer;
   a semi-transmissive reflection layer;
   a light-emitting functional layer that is disposed between the reflection layer and the semi-transmissive reflection layer; and
   an adjustment layer that is disposed between the reflection layer and the light-emitting functional layer, and
   a thickness of the light-emitting functional layer in the second sub-pixel is thicker than a thickness of the light-emitting functional layer in the first sub-pixel.

7. The light-emitting device according to claim 6, wherein the thickness of the light-emitting functional layer in the first sub-pixel is same as a thickness of the light-emitting functional layer in the third sub-pixel,
   a thickness of the adjustment layer in the first sub-pixel is same as a thickness of the adjustment layer in the second sub-pixel, and
   a thickness of the adjustment layer in the third sub-pixel is different from the thickness of the adjustment layer in the first sub-pixel and the thickness of the adjustment layer in the second sub-pixel.

8. The light-emitting device according to claim 7, wherein the first sub-pixel is arranged in a center of a display region more than the second sub-pixel.

9. The light-emitting device according to claim 6, wherein the first sub-pixel is arranged in a center of a display region more than the second sub-pixel.

* * * * *